(12) United States Patent
Aritome

(10) Patent No.: US 7,414,284 B2
(45) Date of Patent: Aug. 19, 2008

(54) NONVOLATILE SEMICONDUCTOR MEMORY AND MANUFACTURING METHOD THEREOF

(75) Inventor: Seiichi Aritome, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/672,361

(22) Filed: Feb. 7, 2007

(65) Prior Publication Data

US 2007/0128778 A1 Jun. 7, 2007

Related U.S. Application Data

(60) Continuation of application No. 11/100,492, filed on Apr. 7, 2005, now Pat. No. 7,192,831, which is a division of application No. 10/178,263, filed on Jun. 25, 2002, now Pat. No. 6,891,246.

(30) Foreign Application Priority Data

Jun. 26, 2001 (JP) ............... 2001-193518

(51) Int. Cl.
H01L 29/788 (2006.01)
(52) U.S. Cl. .............. 257/316; 257/E21.179
(58) Field of Classification Search ......... 438/257–267; 257/316–324, E21.179
See application file for complete search history.

(56) References Cited

U.S. PATENT DOCUMENTS

| 5,153,143 | A | * | 10/1992 | Schlais et al. ............... 438/201 |
|---|---|---|---|---|
| 6,080,624 | A | | 6/2000 | Kamiya et al. |
| 6,160,297 | A | | 12/2000 | Shimizu et al. |
| 6,222,225 | B1 | | 4/2001 | Nakamura et al. |
| 6,239,465 | B1 | | 5/2001 | Nakagawa |
| 6,258,699 | B1 | | 7/2001 | Park |
| 6,265,739 | B1 | | 7/2001 | Yaegashi et al. |
| 6,342,715 | B1 | | 1/2002 | Shimizu et al. |
| 6,891,246 | B2 | | 5/2005 | Aritome |
| 2002/0179962 | A1 | | 12/2002 | Kinoshita |

FOREIGN PATENT DOCUMENTS

JP 8-17948 1/1996

(Continued)

OTHER PUBLICATIONS

S. Aritome, et al., "A 0.67 um² Self-Alligned Shallow Trench Isolation Cell (SA-STI Cell) for 3V-Only 256Mbit NAND EEPROMs", IEDM, 1994, pp. 61-64.

*Primary Examiner*—Richard A. Booth
(74) *Attorney, Agent, or Firm*—Oblon, Spivak, McClelland, Maier & Neustadt, P.C.

(57) ABSTRACT

A nonvolatile semiconductor memory includes a trench isolation provided in a semiconductor substrate and an interlayer insulator provided on the semiconductor substrate. The trench isolation defines an active area extending in a first direction at the semiconductor substrate. The interlayer insulator has a wiring trench extending in a second direction intersecting the first direction. A first conductive material layer is provided at the cross-point of the active area and the wiring trench so that it is insulated from the active area. A second conductive material layer is provided in the wiring trench so that it is insulated from the first conductive material layer. A metal layer is provided in the wiring trench so that it is electrically in contact the second conductive material layer.

7 Claims, 25 Drawing Sheets

FOREIGN PATENT DOCUMENTS

| | | |
|---|---|---|
| JP | 10-223867 | 8/1998 |
| JP | 10-335497 | 12/1998 |
| JP | 11-17156 | 1/1999 |
| JP | 11-26731 | 1/1999 |
| JP | 11-31799 | 2/1999 |
| JP | 11-261038 | 9/1999 |
| JP | 2002-110824 | 4/2002 |
| WO | WO 00/38237 | 6/2000 |

* cited by examiner

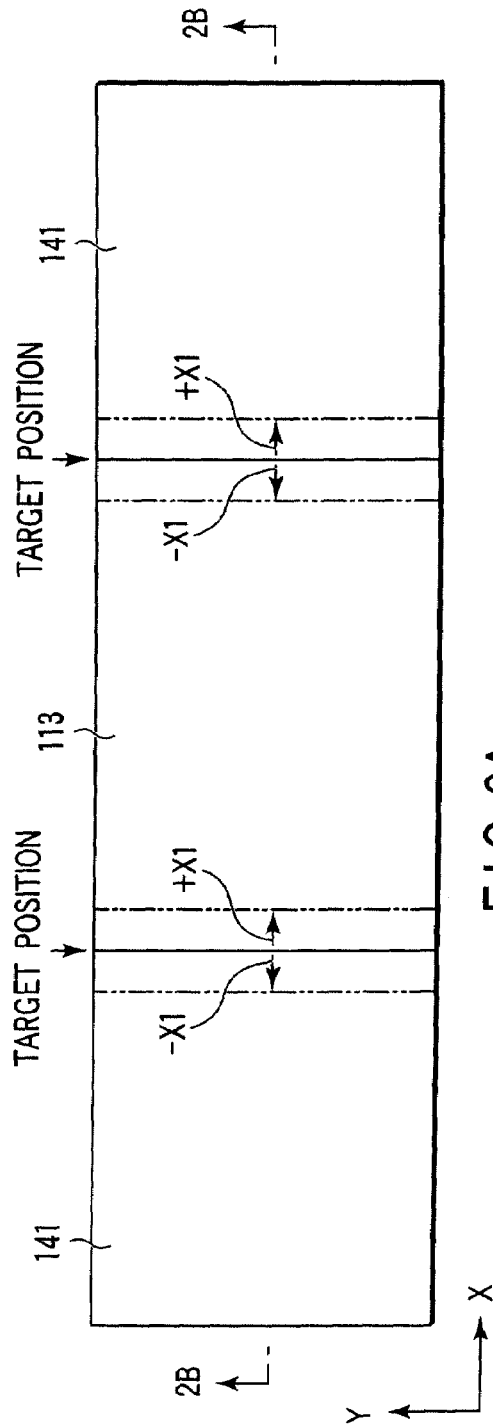
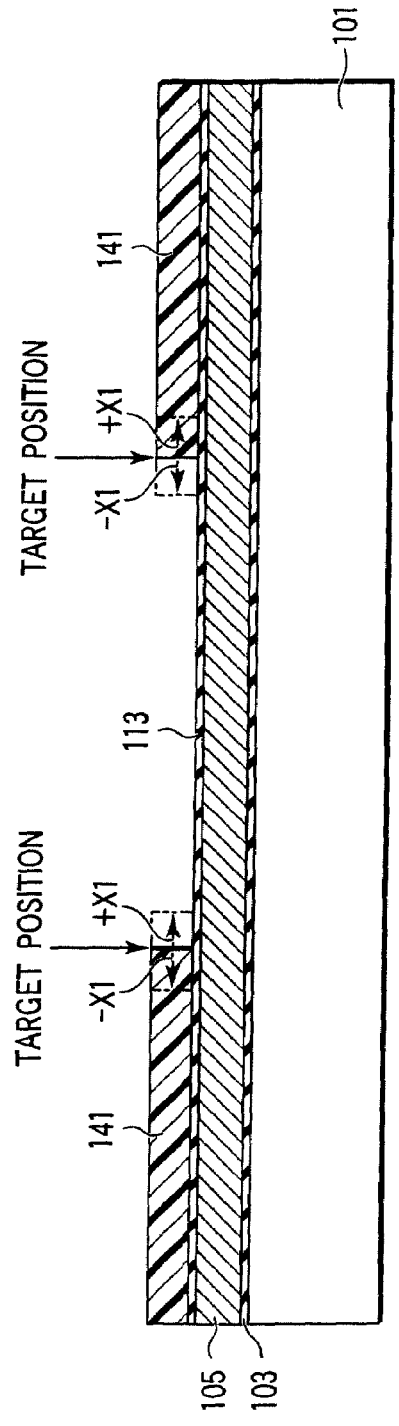
FIG. 2A PRIOR ART
FIG. 2B PRIOR ART

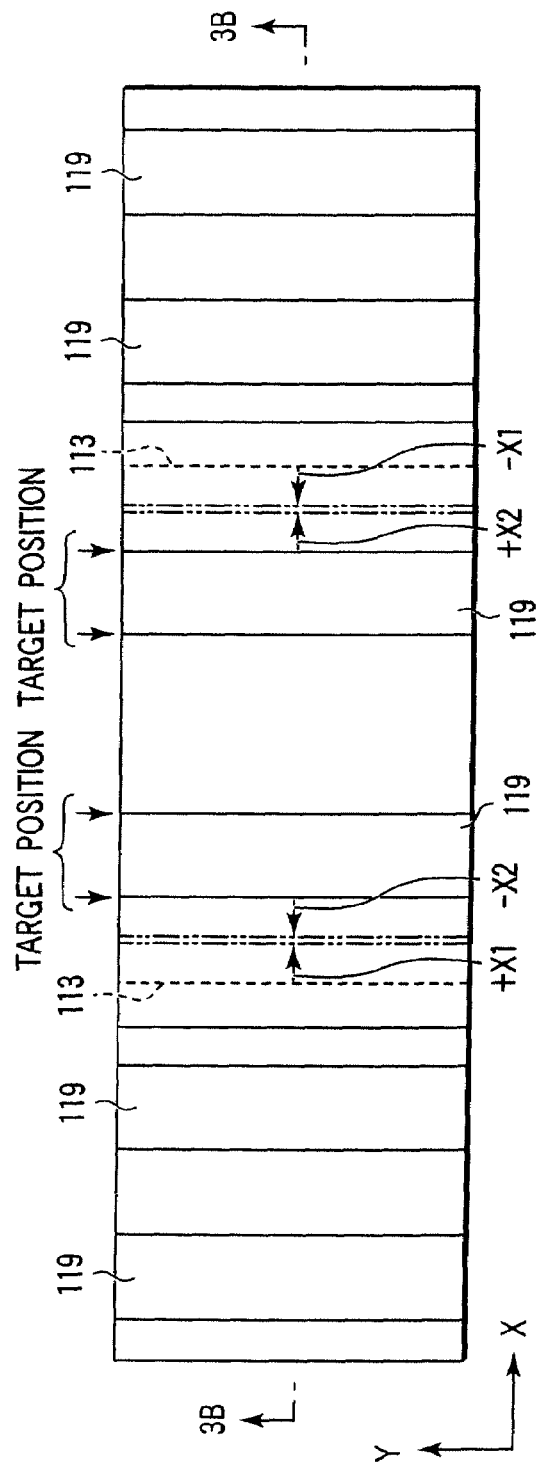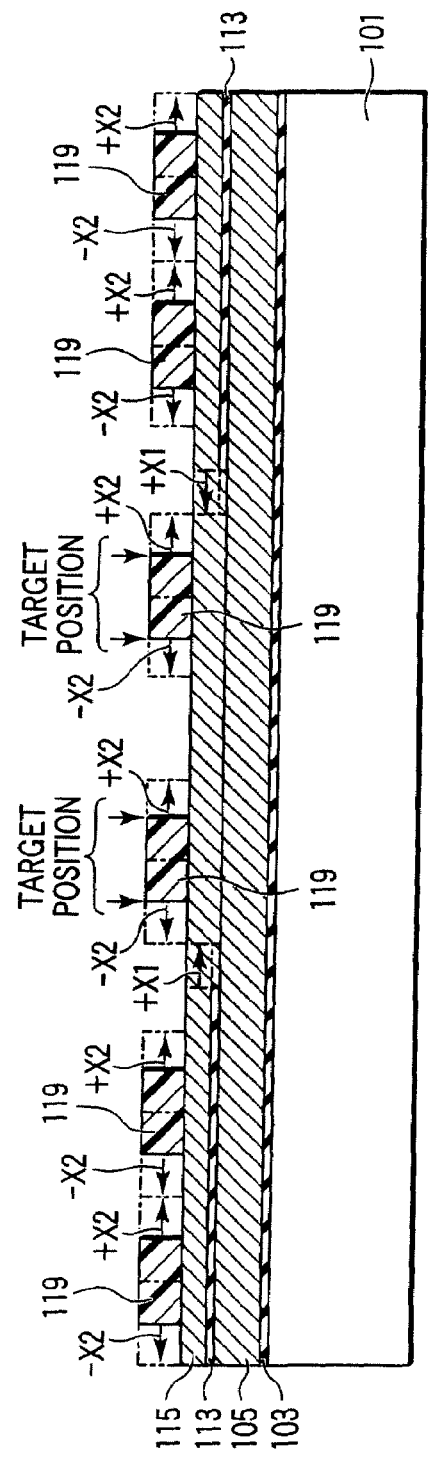
FIG. 3A PRIOR ART
FIG. 3B PRIOR ART

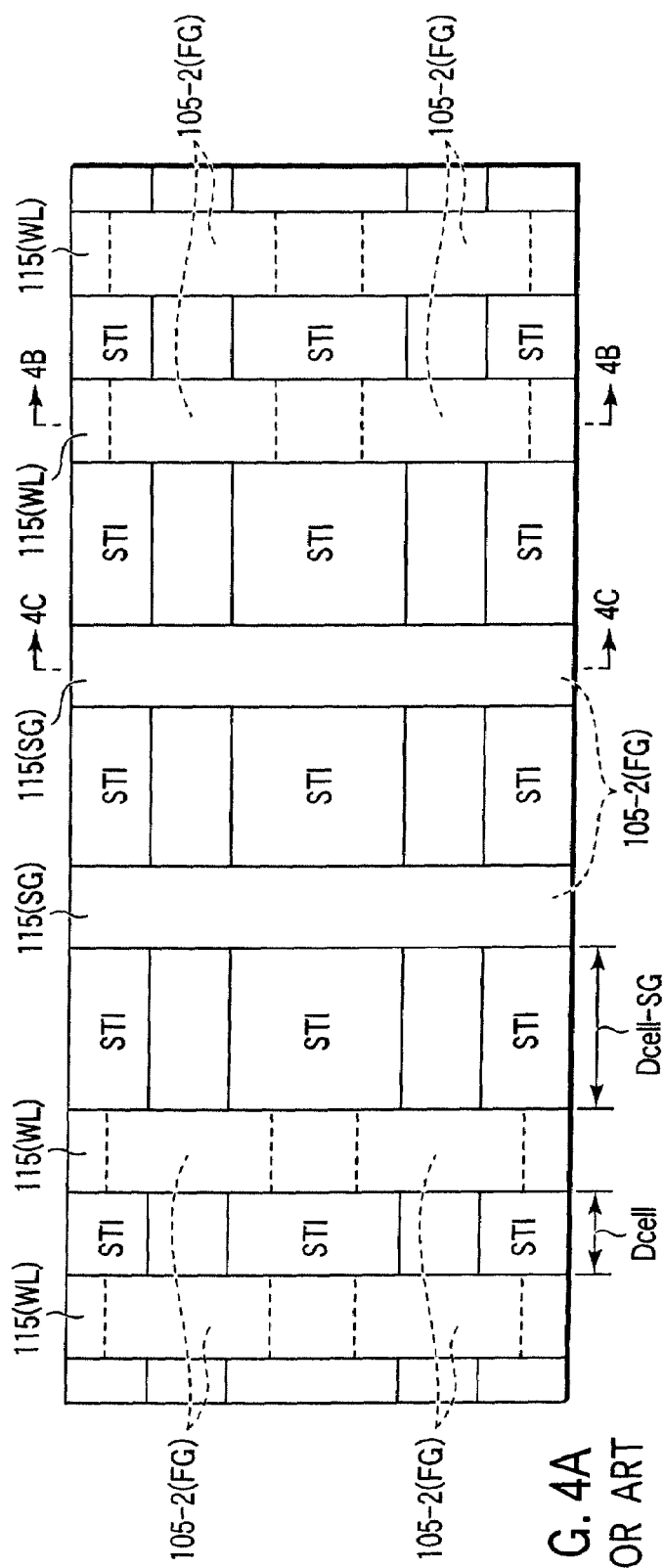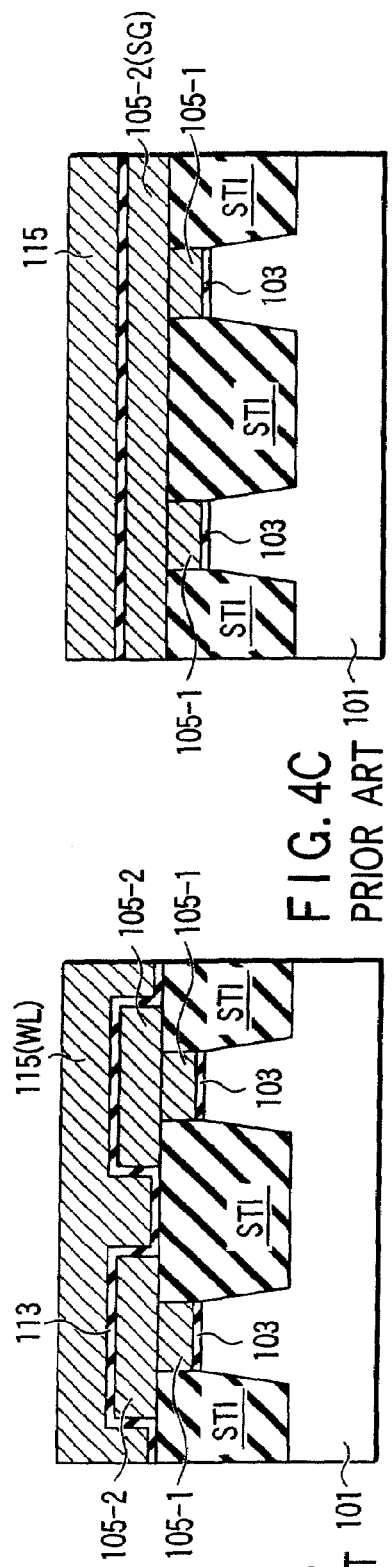
FIG. 4A PRIOR ART
FIG. 4B PRIOR ART
FIG. 4C PRIOR ART

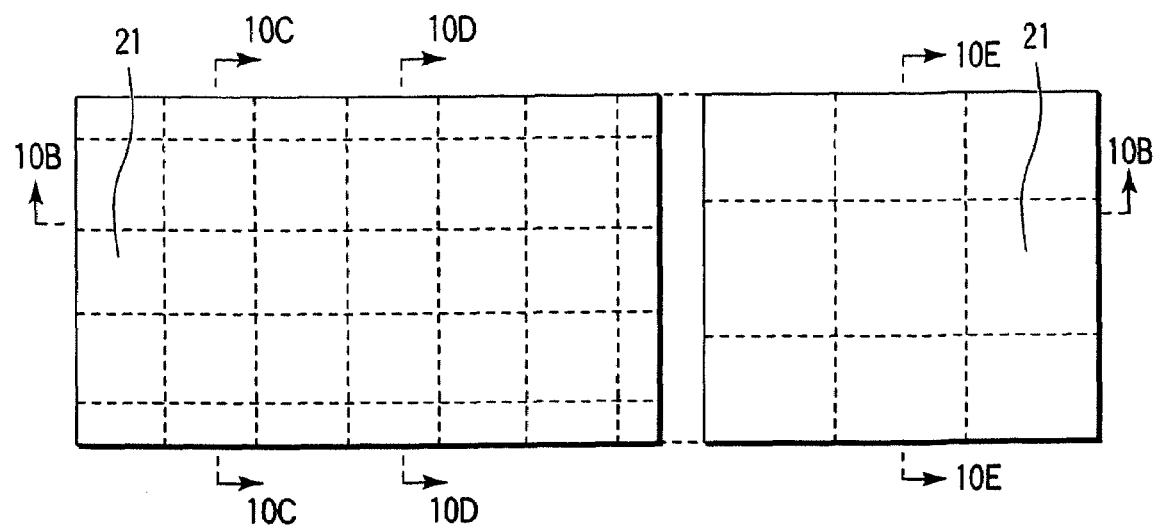
F I G. 10A
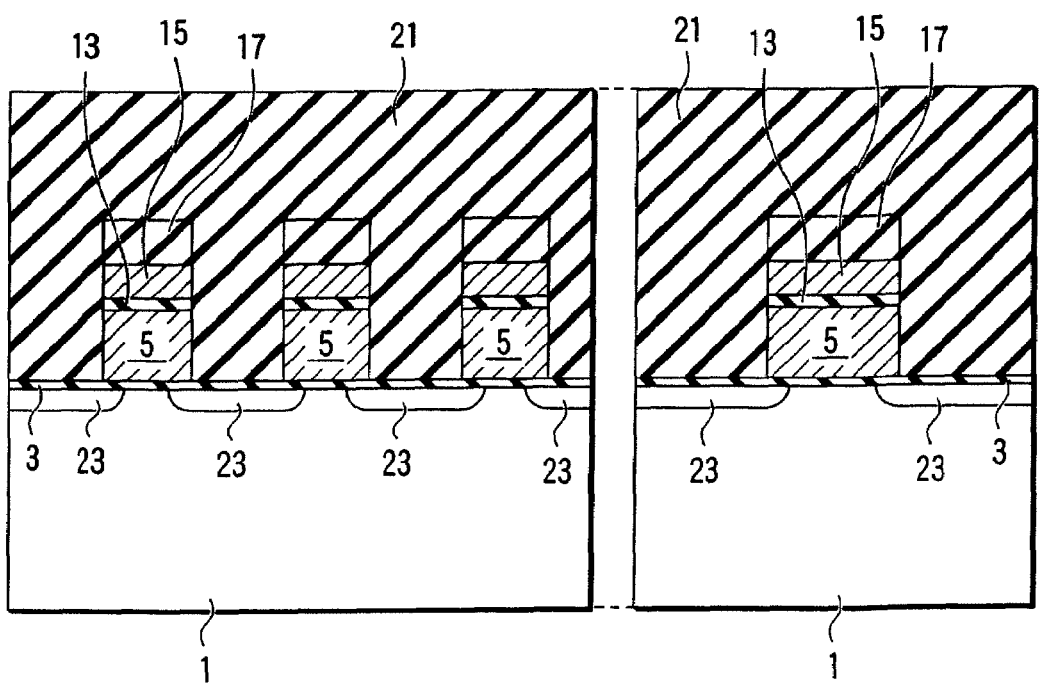
F I G. 10B

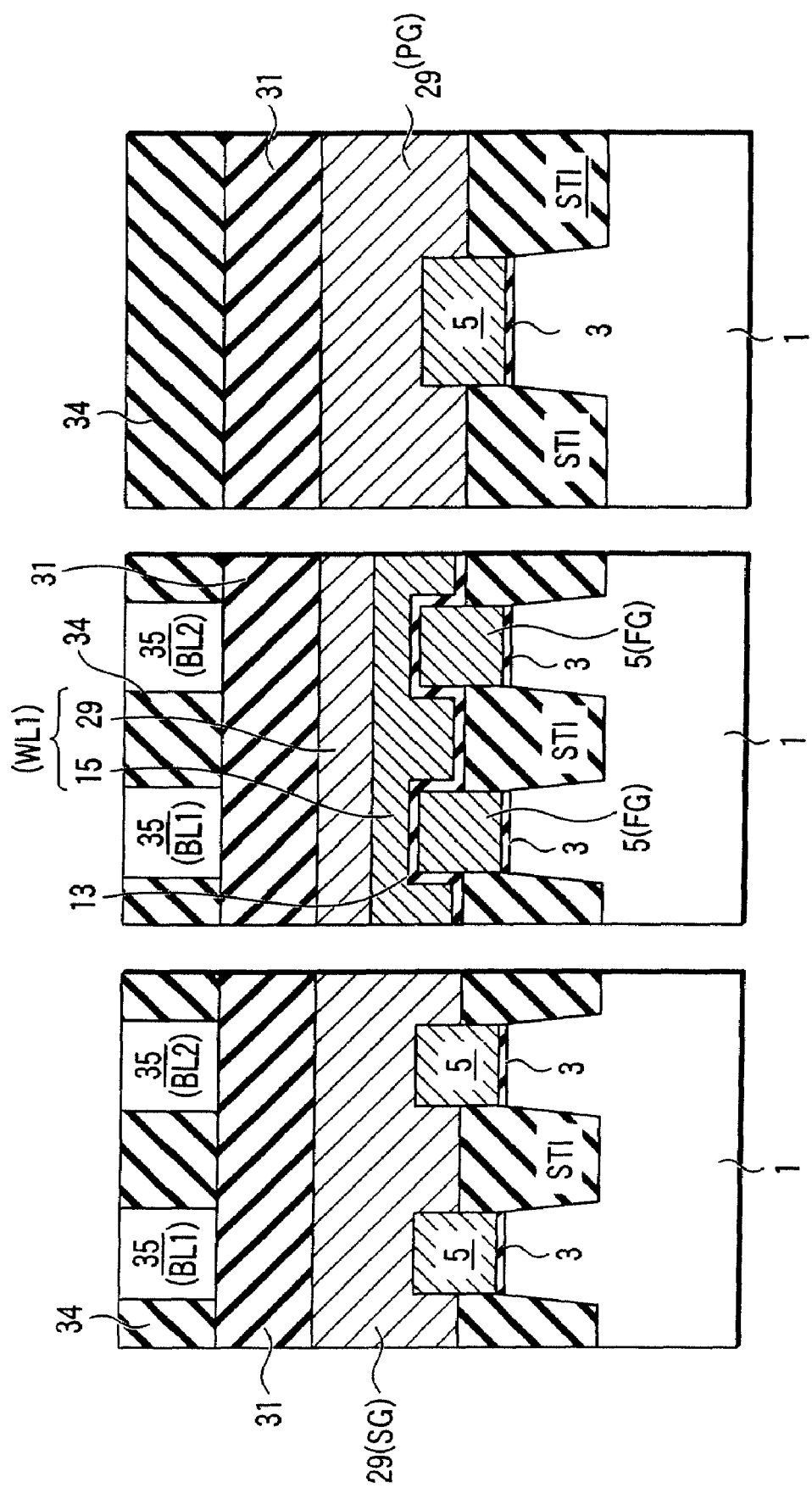

NONVOLATILE SEMICONDUCTOR MEMORY AND MANUFACTURING METHOD THEREOF

CROSS-REFERENCE TO RELATED APPLICATIONS

This continuation application is based upon and claims the benefit of priority under 35 U.S.C. §120 from U.S. application Ser. No. 11/100,492, filed Apr. 7, 2005 now U.S. Pat. No. 7,192,831, which is a divisional of U.S. application Ser. No. 10/178,263, filed Jun. 25, 2002 now U.S. Pat. No. 6,891,246, and is based upon and claims the benefit of priority under 35 U.S.C. §119 from the prior Japanese Patent Application No. 2001-193518, filed Jun. 26, 2001, the entire contents of each are incorporated herein by reference.

BACKGROUND OF THE INVENTION

1. Field of the Invention

The present invention relates to a nonvolatile semiconductor memory, and in particular, to a structure of a gate electrode.

2. Description of the Related Art

FIG. 1A is a plan view of a conventional NAND type nonvolatile semiconductor memory, FIG. 1B is a sectional view taken along the line 1B-1B in FIG. 1A, and FIG. 1C is a sectional view taken along the line 1C-1C in FIG. 1A. Note that FIGS. 1A to 1C respectively show points in time when a control gate (word line WL) of a memory cell transistor and a gate (select gate line SG) of a select transistor are formed.

Reference: S. Aritome et al, "A 0.67 µm² SELF-ALIGNED SHALLOW TRENCH ISOLATION CELL (SA-STI CELL) FOR 3V-only 256 Mbit NAND EEPROMs", IEDM, pp 61-64, 1994.

As shown in FIGS. 1A to 1C, shallow trench isolations (STIs) are formed as element isolation regions in a P-type well 101, and element regions are defined. Gate insulators 103 are formed on the element regions of the P-type well 101. Conductive polysilicon layers 105, an ONO film 113, and conductive polysilicon layers 115 are formed on the gate insulators 103.

The conductive polysilicon layers 105 form floating gates (FG) in the memory cell transistor (refer to FIG. 1B), and contact the conductive polysilicon layer 115 in a select transistor, and form portions of select gate lines SG (refer to FIG. 1C). Further, the conductive polysilicon layer 115 forms a word line WL (refer to FIG. 1B).

In this way, in the prior art, the word line WL and the select gate line SG are formed from the conductive polysilicon layers 115. Further, although not illustrated in particular, this prior art is formed from a structure in which a tungsten silicide layer is formed on the conductive polysilicon layer 115, i.e., a so-called a polycide structure.

Moreover, an example of a structural feature of the nonvolatile semiconductor memory shown in FIGS. 1A to 1C is that the conductive polysilicon layers 105 are divided by the STIs in a select transistor portion. Therefore, the ONO film 113 is removed from the select transistor portion, and the divided conductive polysilicon layers 105 are connected to each other by the conductive polysilicon layer 115, and the select gate line SG is formed (refer to FIG. 1C).

However, in order to remove the ONO film 113, a space Dcell-SG from the select gate line SG to the word line WL must be made broader than a space Dcell from the word line WL to the word line WL. The reason for this is that the alignment margin of the mask layer for removing the ONO film 113, and the alignment margin of the select gate SG and the portion at which the ONO film 113 is removed, respectively, must be anticipated.

Concretely, as shown in FIG. 2A and FIG. 2B, mask layers 141 for removing the ONO film 113 are offset within a range of "+X1" or "–X1" along the X direction from the forming target position. Accordingly, alignment margins of "+X1" and "–X1" from the forming target position are necessary.

Moreover, as shown in FIG. 3A and FIG. 3B, mask layers 119 for forming the word line WL and the select gate line SG are, in the same way, offset within a range of "+X2" or "–X2" along the X direction from the forming target position. Accordingly, alignment margins of "+X2" and "–X2" from the forming target position are necessary.

As a result, in order for the portion at which the ONO film 113 is removed to always be positioned under the mask layers 119, an alignment margin of "|X1|+|X2|" is necessary between the forming target position of the mask layers 114 and the forming target position of the mask layers 119.

However, in FIGS. 2A, 2B, 3A and 3B, because attention is focused on the alignment margin between the select gate line SG and the word line WL, an adjusting margin in the Y direction orthogonal to the X direction is ignored.

Further, a NAND type nonvolatile semiconductor memory as shown in FIGS. 4A to 4C has also been known.

Reference: Jpn. Pat. Appln. KOKAI Publication No. 11-26731 (U.S. Pat. No. 6,342,715 B1)

FIG. 4A is a plan view, FIG. 4B is a sectional view taken along the line 4B-4B in FIG. 4A, and FIG. 4C is a sectional view taken along the line 4C-4C in FIG. 4A.

One of the main features of the device shown in FIGS. 4A to 4C is that the floating gates 105 have a double structure of a lower layer portion 105-1 and an upper layer portion 105-2. Further, the upper layer 105-2 spreads on the STIs, and the capacity between the control gates 115 (word lines WL) and the floating gates 105 is sufficiently larger than the capacity of the channels and the floating gates 105.

Moreover, in the select transistor portion, select gates SG are formed by the conductive polysilicon layers structuring the upper layer portions 105-2. In this way, the step of removing the ONO film 113 can be omitted.

However, in the device shown in FIGS. 4A to 4C, in the memory cell transistor portion, a so-called slit processing, for dividing the conductive polysilicon layer constituting the upper layer portions 105-2 for the respective memory cells, is necessary. Therefore, an alignment margin for the slit processing is firstly necessary. Moreover, an alignment margin, for exactly positioning the masks for select gate processing on the conductive polysilicon layers forming the upper layer portions 105-2 in which slits are not formed, is necessary.

Accordingly, even if the step of removing the ONO film 113 is eliminated, an alignment margin which is equivalent to that of the device shown in FIGS. 1A to 1C is necessary between the select gate lines SG and the word lines WL. As a result, in the device shown in FIG. 4A to 4C as well, the space Dcell-SG from the select gate line SG to the word line WL must be broader than the space Dcell from the word line WL to the word line WL.

In this way, in the conventional nonvolatile semiconductor memory, lowering of the resistance is attempted by structuring the word line WL and the select gate line SG from the conductive polysilicon layers 115, or from a polycide structure. However, as nonvolatile semiconductor memories have become smaller, it has become difficult to further lower the resistance.

Moreover, in the conventional nonvolatile semiconductor memory, in order to remove the ONO film 113 from the select transistor portion or in order to carry out slit processing, the space Dcell-SG from the select gate line SG to the word line WL must be broader than the space Dcell from the word line WL to the word line WL. This is an obstacle to further miniaturization of a nonvolatile semiconductor memory.

BRIEF SUMMARY OF THE INVENTION

A nonvolatile semiconductor memory device according to a first aspect of the present invention comprises:
 a semiconductor substrate;
 a trench isolation provided in the semiconductor substrate, the trench isolation defining an active area at the semiconductor substrate, the active area extending in a first direction;
 an interlayer insulator provided on the semiconductor substrate, the interlayer insulator having a wiring trench, the wiring trench extending in a second direction intersecting the first direction;
 a first conductive material layer provided at a cross-point of the active area and the wiring trench, the first conductive material layer being insulated from the active area;
 a second conductive material layer provided in the wiring trench, the second conductive material layer being insulated from the first conductive material layer; and
 a metal layer provided in the wiring trench, the metal layer electrically contacting the second conductive material layer.

A method for manufacturing a nonvolatile semiconductor memory device according to a second aspect of the present invention comprises:
 forming a first stacked structure including at least a gate insulator and a first conductive material layer on a semiconductor substrate;
 forming trenches corresponding to a pattern of element isolation regions from the first stacked structure into the semiconductor substrate;
 forming an insulating material in the trenches;
 forming a second stacked structure including at least an inter-gate insulator and a second conductive material layer on the exposed surfaces of the insulating material and the first stacked structure;
 forming a plurality of stacked gate structures including at least the first conductive material layer, a second gate insulator, and the second conductive material layer by patterning the first stacked structure and the second stacked structure;
 forming an interlayer insulator between the stacked gate structures;
 forming trenches corresponding to the pattern of the stacked gate structures at the interlayer insulator by partially removing the stacked gate structure; and
 forming a third conductive material layer in the trenches.

BRIEF DESCRIPTION OF THE SEVERAL VIEWS OF THE DRAWING

FIG. 2A is a plan view showing a main step of manufacturing a conventional NAND type nonvolatile semiconductor memory, and FIG. 2B is a sectional view taken along the line 2B-2B in FIG. 2A.

FIG. 3A is a plan view showing one of the main steps of manufacturing a conventional NAND type nonvolatile semiconductor memory, and FIG. 3B is a sectional view taken along the line 3B-3B in FIG. 3A.

FIG. 4A is a plan view of a conventional NAND type nonvolatile semiconductor memory, FIG. 4B is a sectional view taken along the line 4B-4B in FIG. 4A, and FIG. 4C is a sectional view taken along the line 4C-4C in FIG. 4A.

FIG. 10A is a plan view showing one of the main steps of manufacturing a nonvolatile semiconductor memory according to the embodiment of the present invention, FIG. 10B is a sectional view taken along the line 10B-10B in FIG. 10A.

FIG. 19C is a sectional view taken along the line 19C-19C in FIG. 19A, FIG. 19D is a sectional view taken along the line 19D-19D in FIG. 19A, and FIG. 19E is a sectional view taken along the line 19E-19E in FIG. 19A.

DETAILED DESCRIPTION OF THE INVENTION

Figure 1A:
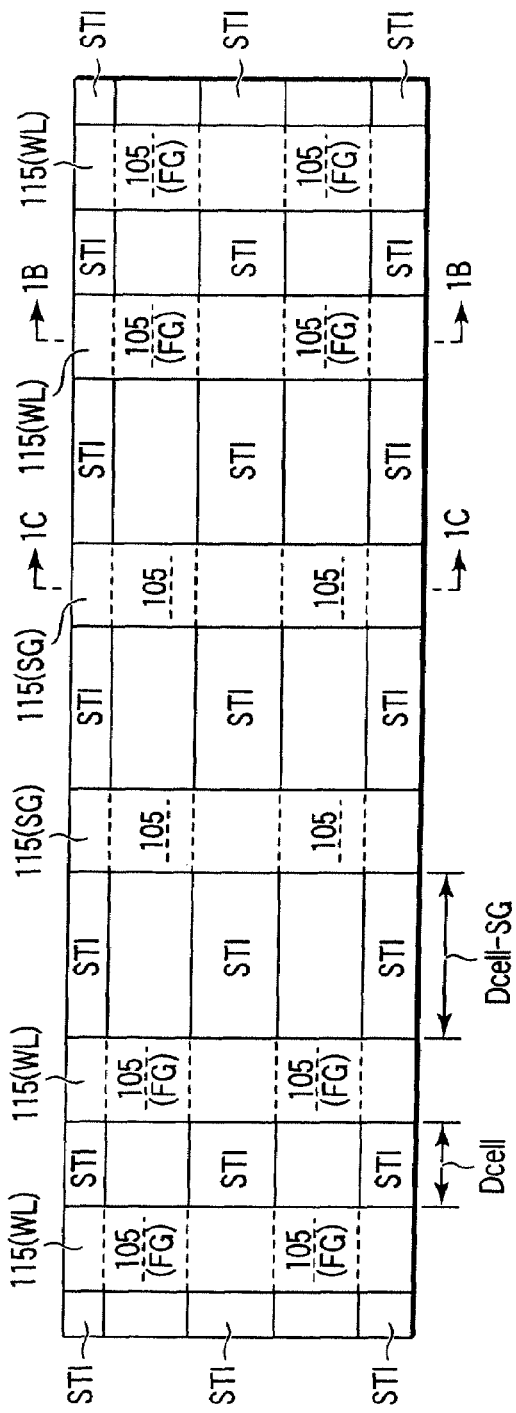
FIG. 1A is a plan view of a conventional NAND type nonvolatile semiconductor memory.

Hereinafter, an embodiment of the present invention will be described with reference to the figures. In this description, the same reference numerals are assigned to common parts throughout all of the figures.

FIGS. 5A, 5B, 5C, 5D, and 5E to FIGS. 19A, 19B, 19C, 19D, and 19E are respectively plan views or sectional views showing a NAND type nonvolatile semiconductor memory according to the embodiment of the present invention in respective main manufacturing processes.

Firstly, as shown in FIGS. 5A to 5E, gate insulators 3 formed from, for example, $SiO_2$, are formed on a P-type silicon substrate 1. Note that, although not illustrated in particular, in the present example, for example, a P-type well is formed in the P-type silicon substrate 1 in a memory cell array. Further, in the P-type silicon substrate 1 in a peripheral circuit, for example, the aforementioned P-type well and another P-type well are formed. Next, on the gate insulators 3, for example, conductive polysilicon layers 5 are formed. The polysilicon layers 5 are layers which will become floating gates later. Hereinafter, the polysilicon layer 5 is called a floating gate (FG) polysilicon layer 5. Next, mask layers 7 formed of, for example, $SiN_X$, are formed on the FG polysilicon layers 5. Next, the mask layers 7 are patterned in shapes of active areas. In the present example, active areas AA1 are set in the memory cell array, and an active area AA2 is set in the peripheral circuit. Next, by using the patterned mask layers 7 as masks, the FG polysilicon layers 5, the gate insulators 3, and the P-type silicon substrate 1 are, for example, anisotropically-etched, and shallow trenches 9 are formed in the P-type silicon substrate 1.

Next, as shown in FIGS. 6A to 6E, insulators 11 are formed on the structure shown in FIGS. 5A to 5E, by laminating, for example, $SiO_2$. Next, by using the mask layers 7 and the FG polysilicon layers 5 as masks, the insulators 11 are etched back, and the FG polysilicon layers 5 are projected from the surfaces of the insulators 11, and the insulators 11 remain in the shallow trenches 9. In this way, shallow trench isolations (STI) are formed. One example of the insulator 11 is $SiO_2$.

Next, as shown in FIGS. 7A to 7E, inter-gate insulators 13 are formed on the structure shown in FIGS. 6A to 6E. One example of the inter-gate insulator 13 is an ONO film. The ONO film is formed by sequentially forming $SiO_2$, $SiN_X$, $SiO_2$ on the structure shown in FIGS. 6A to 6E. Next, on the inter-gate insulator 13, for example, a conductive polysilicon layer 15 is formed. The polysilicon layer 15 will become a layer structuring one portion of a control gate later. Next, on the polysilicon layer 15, a cap layer 17 formed of, for example, $SiN_X$, is formed.

Next, as shown in FIGS. 8A to 8E, photoresist films 19, corresponding to respective patterns of a control gate of a memory cell transistor, a select gate of a select transistor, and a gate of a peripheral transistor, are formed on the structure shown in FIGS. 7A to 7E. Next, by using the photoresist films as masks, cap layers 17, the polysilicon layers 15, the inter-gate insulators 13, and the FG polysilicon layers 5 are sequentially, for example, anisotropically-etched. In this way, a stacked gate structure including the FG polysilicon layers 5, the inter-gate layers 13, the polysilicon layers 15, and the cap layers 17 is obtained.

Next, as shown in FIGS. 9A to 9E, before the photoresist films 19 are removed or after the photoresist films 19 are removed, by using the stacked gate structure and STI as masks, N-type impurity ions, for example, As ions, are injected into the P-type well 1.

Next, as shown in FIGS. 10A to 10E, a first interlayer insulator 21 is formed on the structure shown in FIGS. 9A to 9E by laminating, for example, $SiO_2$.

Next, as shown in FIGS. 11A to 11E, the first interlayer insulator 21 is planarized by using the cap layers 17 as stoppers by, for example, carrying out CMP.

Next, as shown in FIGS. 12A to 12E, by using the first interlayer insulators 21 as masks, the cap layers 17 are removed to expose the polysilicon layers 15. At this time, by removing the cap layers 17, wiring trenches 25 (25SG, 25WL, 25PG) can be obtained at the first interlayer insulators 21. The wiring trenches 25 are trenches for embedding gate wirings.

Next, as shown in FIGS. 13A to 13E, a photoresist film 27 is formed on the structure shown in FIGS. 12A to 12E. The photoresist film 27 has a pattern masking on the memory cell transistor. In this way, at the memory cell transistor, the polysilicon layers 15 are covered by the photoresist film 27.

Next, as shown in FIGS. 14A to 14E, by using the photoresist film 27 and the first interlayer insulators 21 as masks, the polysilicon layers 15 and the inter-gate insulators 13 are removed. In this way, the FG polysilicon layers 5 are exposed at the respective bottoms of the wiring trenches 25SG and 25PG among the wiring trenches 25. A gate wiring of the select transistor is embedded into the wiring trench 25SG. A gate wiring of the peripheral transistor is embedded into the wiring trench 25PG.

Next, as shown in FIGS. 15A to 15E, the photoresist film 27 is removed. The polysilicon layers 15 are thereby exposed at the bottom of the wiring trenches 25WL among the wiring trenches 25. Gate wirings of the memory cell transistor are embedded into the wiring trenches 25WL.

Next, as shown in FIGS. 16A to 16E, a metal layer 29 is formed by stacking a metal on the structure shown in FIGS. 15A to 15E. One example of the metal is tungsten. The metal layer 29 contacts the FG polysilicon layers 5 at the wiring trench 25SG and the wiring trench 25PG. Further, the metal layer 29 contacts the polysilicon layers 15 at the wiring trench 25WL.

Next, as shown in FIGS. 17A to 17E, the metal layer 29 is planarized by using the first interlayer insulators 21 as stoppers by, for example, carrying out CMP. The metal layers 29 are thereby embedded into the respective wiring trenches 25SG, 25WL and 25PG.

Next, as shown in FIGS. 18A to 18E, a second interlayer insulator 31 is formed on the structure shown in FIGS. 17A to 17E by stacking, for example, $SiO_2$.

Next, as shown in FIGS. 19A to 19E, contact holes, which pass through the second interlayer insulator 31 and the first interlayer insulators 21 and the gate insulators 3 and which reach N-type source/drain regions 23, are formed, and conductive materials 33 are embedded into the formed contact holes. One example of the conductive material 33 is tungsten. In the present example, the conductive materials 33 contact the N-type source/drain region 23 at the bit line side of the select transistor and the two N-type source/drain regions 23 of the peripheral transistor. Next, third interlayer insulators 34 are formed on the second interlayer insulators 31, and trenches for embedding bit lines and trenches for embedding wiring of the peripheral circuit are formed at the third interlayer insulators 34. Conductive materials 35 are embedded into the formed trenches. One example of the conductive material 35 is copper. In this way, bit lines BL (BL1, BL2) and wiring of the peripheral circuit are formed, and the nonvolatile semiconductor memory according to the embodiment of the present invention is completed.

Figure 20:
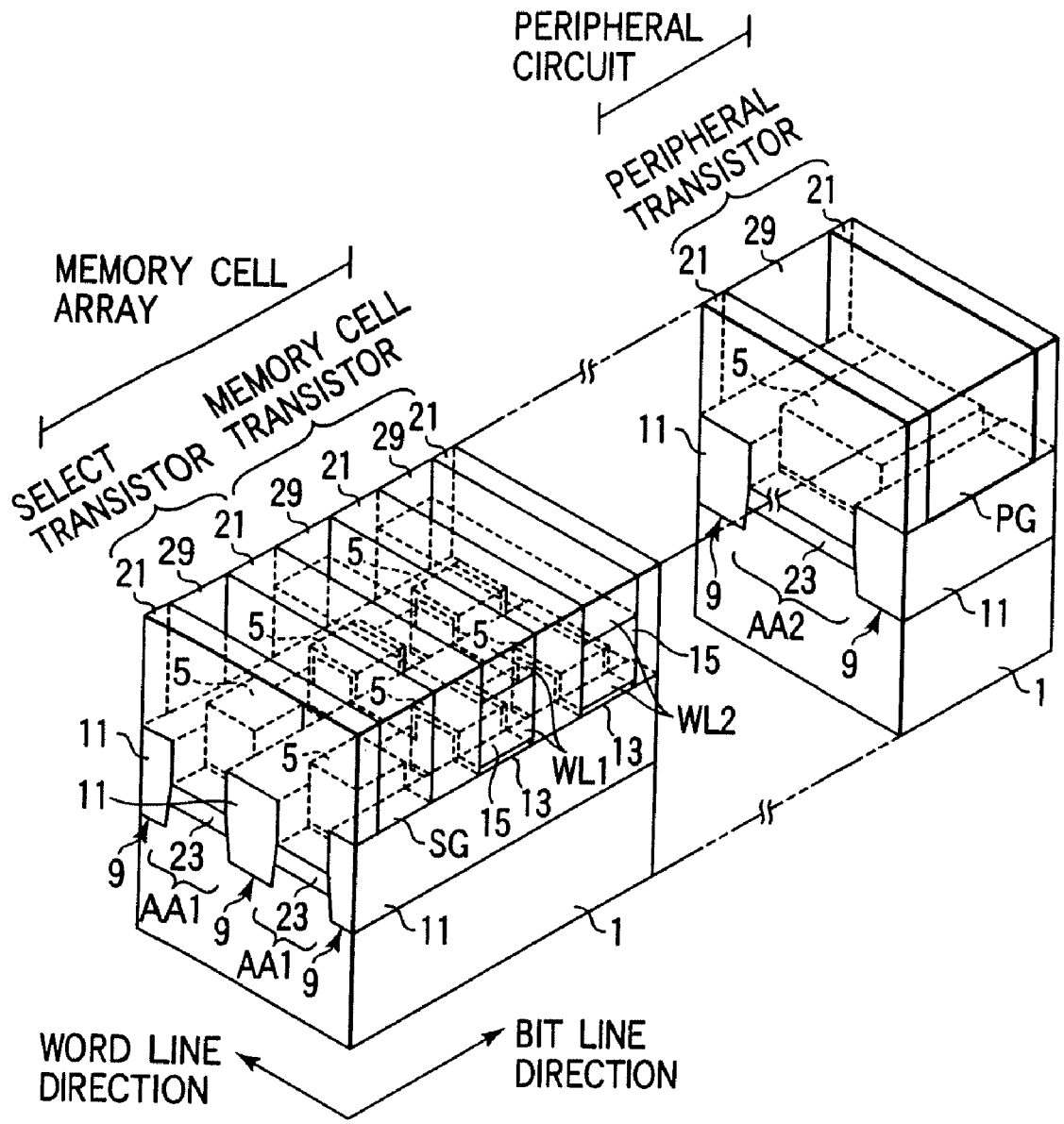
FIG. 20 is a perspective view showing a nonvolatile semiconductor memory according to the embodiment of the present invention.
Figure 21:
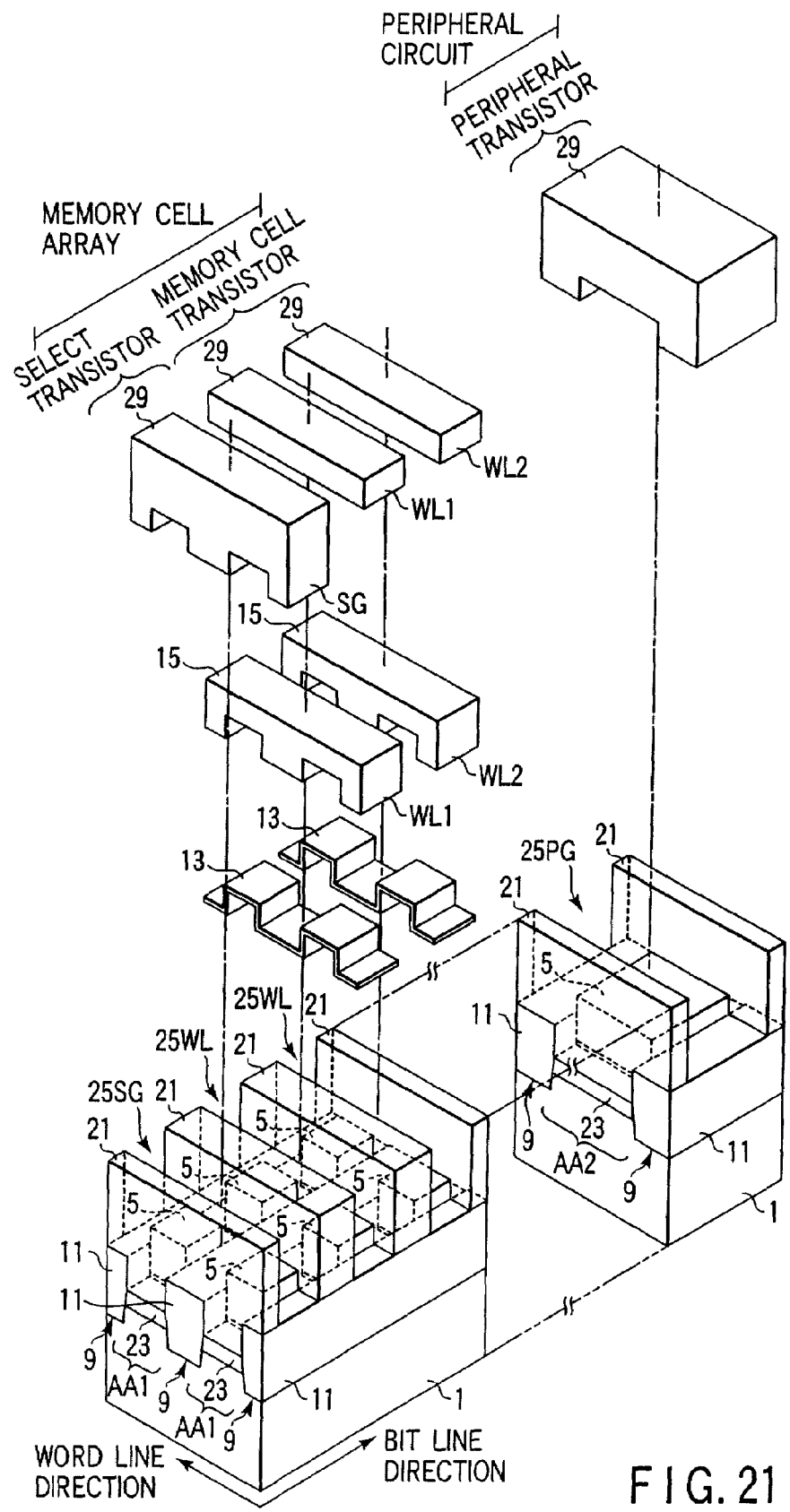
FIG. 21 is an exploded perspective view showing, in an exploded state, the nonvolatile semiconductor memory shown in FIG. 20.
Figure 22:
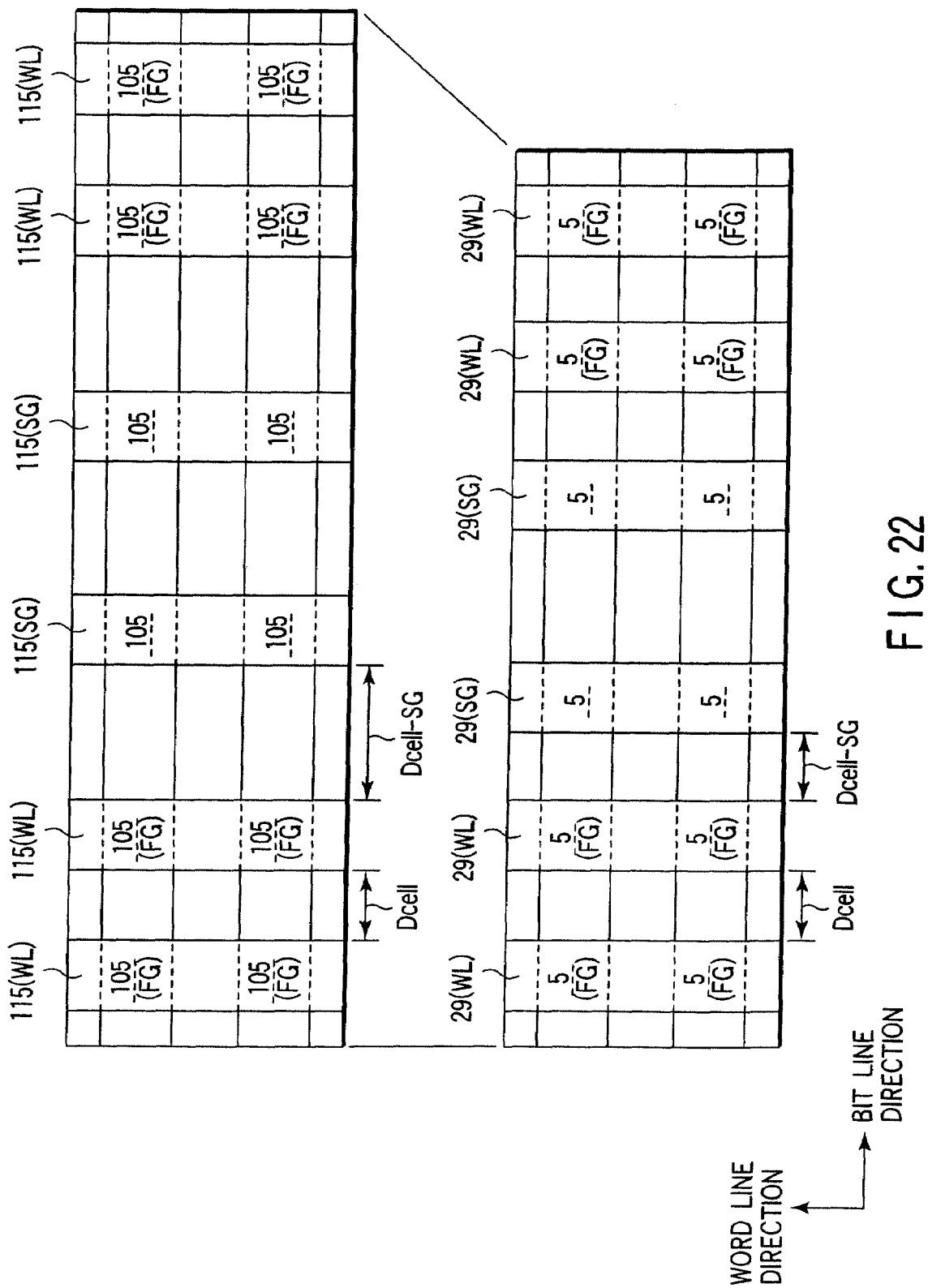
FIG. 22 is a view for explaining effects in accordance with the nonvolatile semiconductor memory according to the embodiment of the present invention.
Figure 23:
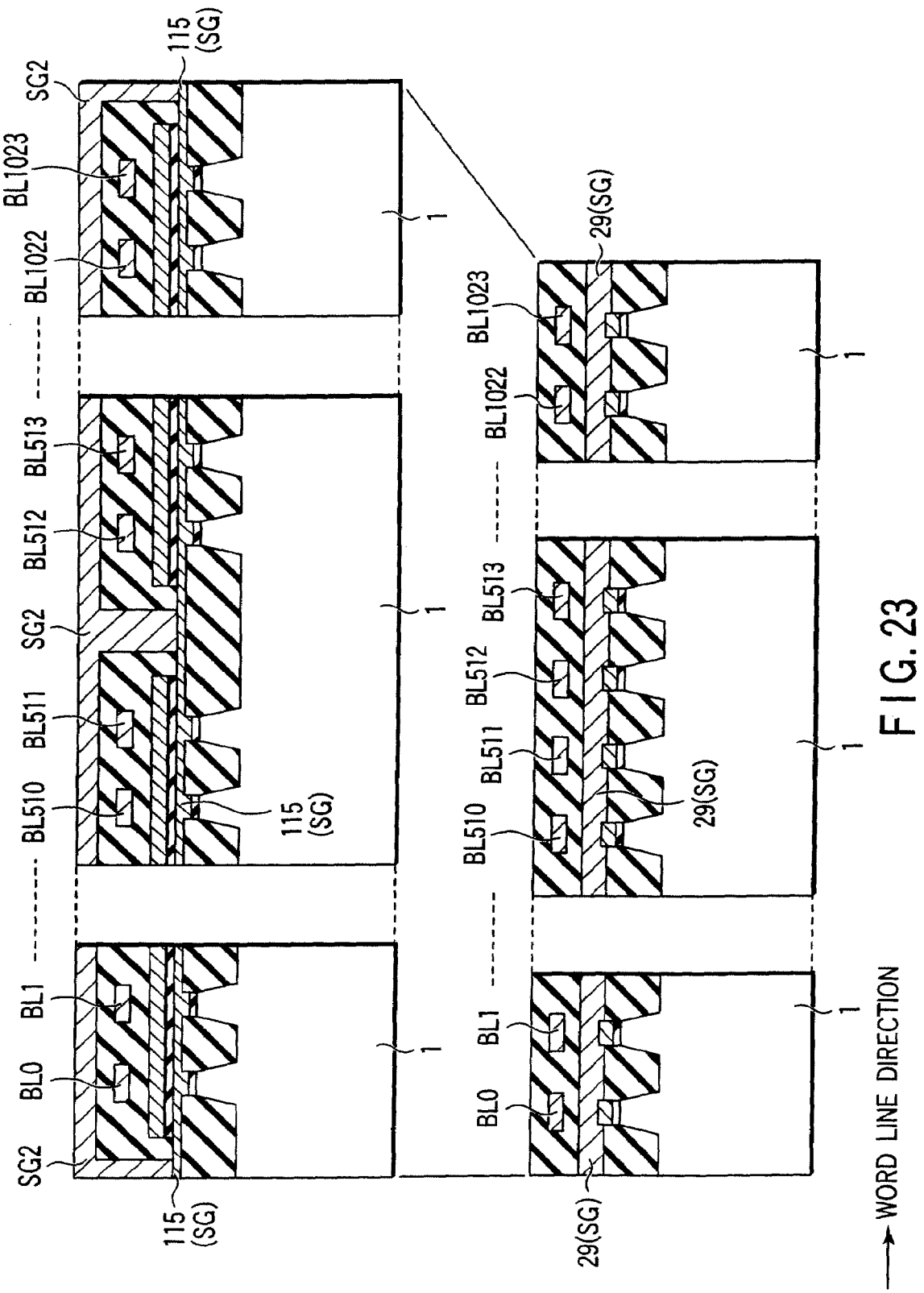
FIG. 23 is a view for explaining effects in accordance with the nonvolatile semiconductor memory according to the embodiment of the present invention.

FIG. 20 is a perspective view showing the nonvolatile semiconductor memory according to the embodiment of present invention, and FIG. 21 is an exploded perspective view showing, in an exploded state, the nonvolatile semiconductor memory shown in FIG. 20. Note that the conductive materials 33, the second interlayer insulators 31, and the bit line BL are omitted from FIG. 20 and FIG. 21.

As shown in FIG. 20 and FIG. 21, the shallow trenches 9 in which the $SiO_2$ 11 are embedded are provided in the P-type silicon substrate 1. The $SiO_2$ 11 embedded in the shallow trenches 9 form shallow trench isolations. The shallow trench isolation is one of the trench isolations. The shallow trench isolations demarcate the active areas at the P-type silicon substrate 1. In FIG. 20 and FIG. 21, an example is shown in which active areas AA1 are defined in the memory cell array and an active area AA2 is defined in the peripheral circuit. The active areas AA1 extend, for example, in the bit line direction. The active area AA2 extends in the bit line direction in the present example. The first interlayer insulators 21 are provided on the P-type silicon substrate 1, and the first interlayer insulators 21 have the wiring trenches 25. In the present example, there are three types of wiring trenches: the wiring trench 25SG for embedding of the select gate line SG, the wiring trench 25WL for embedding of the word line WL, and the wiring trench 25PG for embedding of the wiring of the peripheral circuit. The wiring trenches 25SG and 25WL extend in the word line direction intersecting the bit line direction. The wiring trench 25PG extends in the word line direction intersecting the bit line direction in the present example. The polysilicon layers 5 are respectively provided in a state of being isolated from the active areas AA1 and AA2, at cross-points between the active areas AA1 and the wiring trenches 25SG and 25WL, and at a cross-point between the active area AA2 and the wiring trench 25PG. In the present example, the shallow trench isolations ($SiO_2$ 11) are formed self-aligningly with respect to the polysilicon layers 5. Therefore, for example, the side surfaces of the polysilicon layers 5 contact the side surfaces of the shallow trench isolations ($SiO_2$ 11). Further, in the present example, the position of the top surfaces of the polysilicon layers 5 is higher than the position of the top surfaces of the shallow trench isolations ($SiO_2$ 11). The conductive polysilicon layers 15 are provided in a state of being isolated from the polysilicon layers 5 in the wiring trench 25WL. In the present example, the inter-gate insulators 13 are provided between the polysilicon layers 5 and the polysilicon layers 15. Moreover, the metal layers 29 are provided in the wiring trenches 25SG, 25WL, and 25PG. The metal layers 29 electrically contact the polysilicon layers 15 in the wiring trenches 25WL, and electrically contact the polysilicon layers 5 in the wiring trenches 25SG and 25PG. The metal layers 29 are metals embedded in the wiring trenches 25SG, 25WL and 25PG. Therefore, for example, the position of the top surface of the metal layer 29 coincides with the position of the top surface of the first interlayer insulator 21. One example of the metal layers 29 is, as described above, tungsten. In the wiring trenches 25WL, the polysilicon layers 5, 15, and the metal layers 29 structure the stacked gates of the memory cell transistor. In the wiring trenches 25WL, the polysilicon layers 5 are floating gates, and the polysilicon layers 15 and the metal layers 29 are control gates. The control gates function as the word lines WL. Further, in the wiring trench 25SG, the polysilicon layers 5 and the metal layers 29 form the gates of the select transistor. In the wiring trench 25SG, the metal layer 29 functions as the select gate line SG. Further, in the wiring trench 25PG, the polysilicon layers 5 and the metal layer 29 form the gates of the peripheral transistor. In the wiring trench 25PG, the metal layer 29 functions as the wiring of the peripheral circuit.

In this nonvolatile semiconductor memory according to the embodiment, portions of the control gate of the stacked gate type memory cell transistor, i.e., the word lines WL (WL1, WL2), are metal embedded in the wiring trenches 25WL.

Figure 1C:
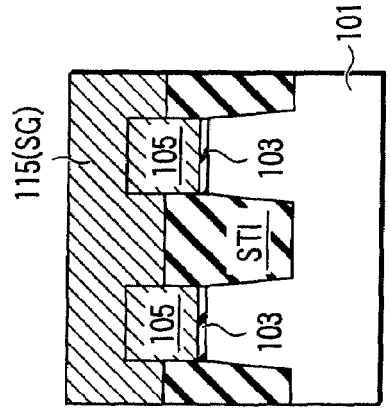
FIG. 1C is a sectional view taken along the line 1C-1C in FIG. 1A.
Figure 1B:
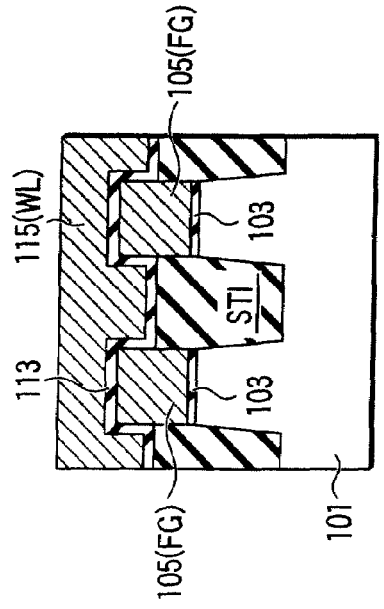
FIG. 1B is a sectional view taken along the line 1B-1B in FIG. 1A.
Figure 5A:
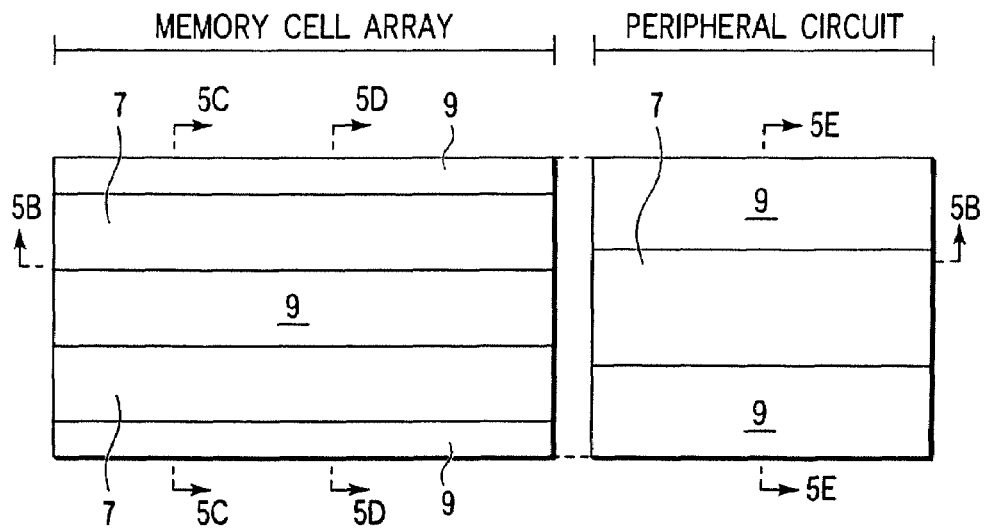
FIG. 5A is a plan view showing one of the main steps of manufacturing a nonvolatile semiconductor memory according to an embodiment of the present invention.
Figure 5B:
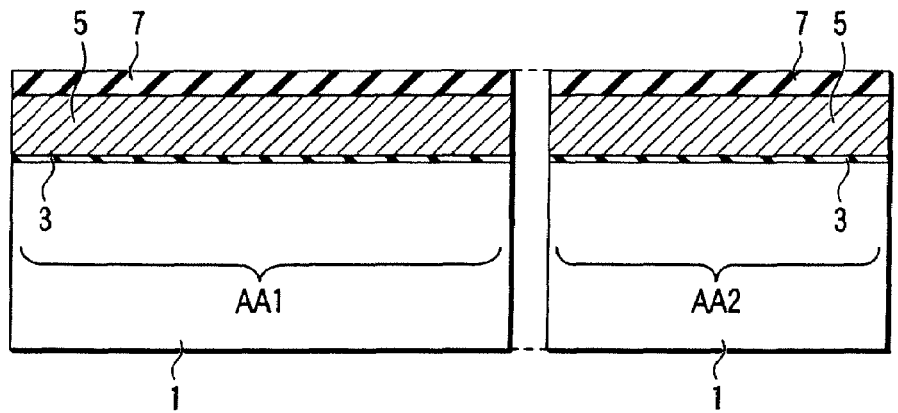
FIG. 5B is a sectional view taken along the line 5B-5B in FIG. 5A.
Figures 5C, 5D, 5E:
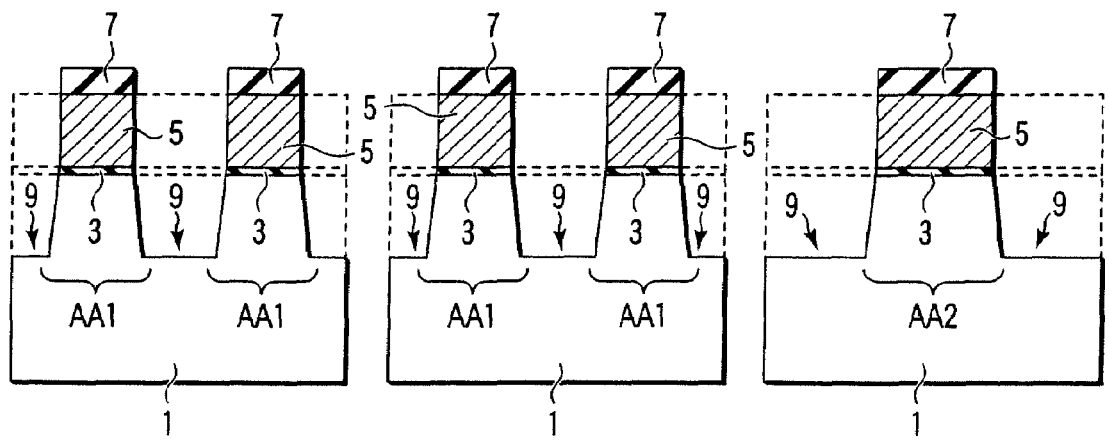
FIG. 5C is a sectional view taken along the line 5C-5C in FIG. 5A.
FIG. 5D is a sectional view taken along the line 5D-5D in FIG. 5A.
FIG. 5E is a sectional view taken along the line 5E-5E in FIG. 5A.
Figure 6A:
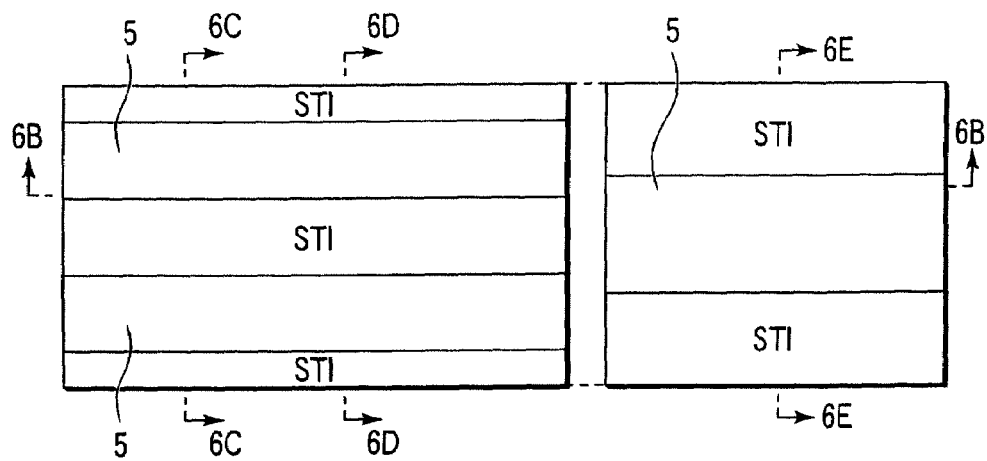
FIG. 6A is a plan view showing one of the main steps of manufacturing a nonvolatile semiconductor memory according to the embodiment of the present invention.
Figure 6B:
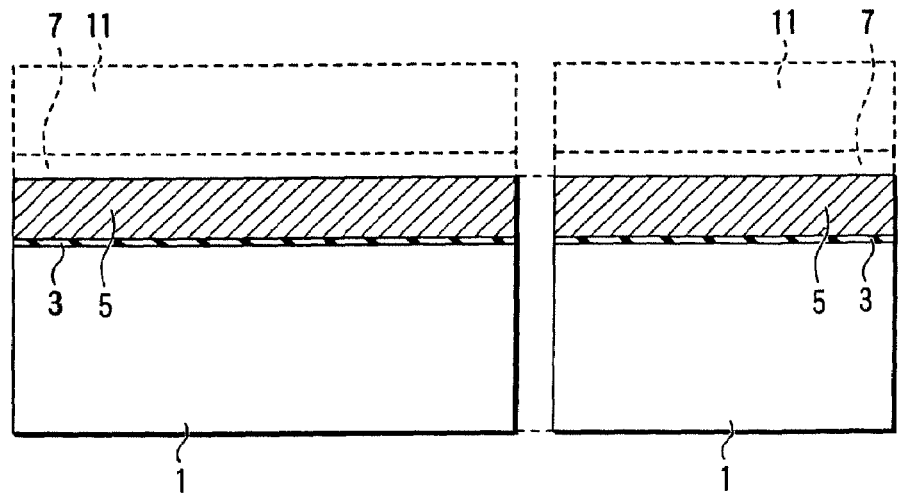
FIG. 6B is a sectional view taken along the line 6B-6B in FIG. 6A.
Figures 6C, 6D, 6E:
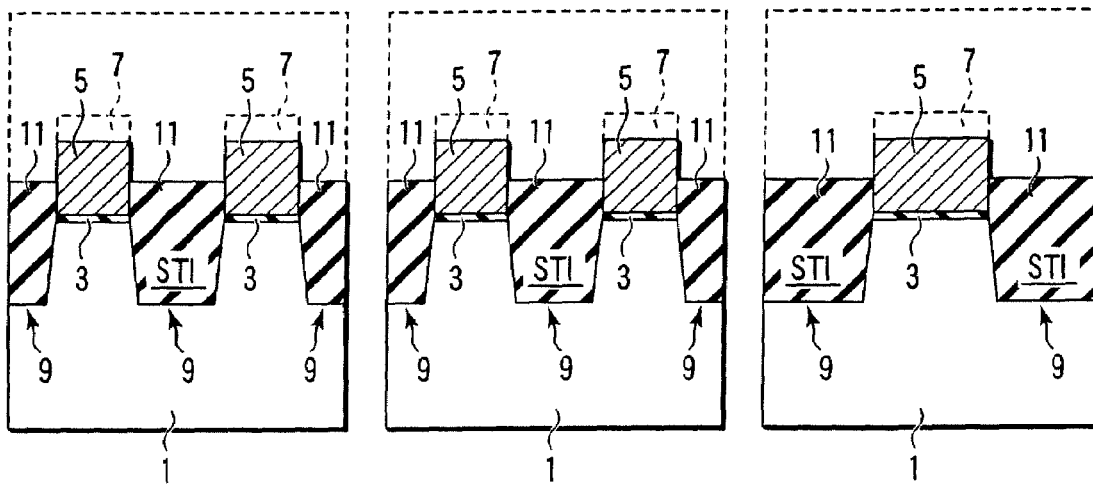
FIG. 6C is a sectional view taken along the line 6C-6C in FIG. 6A.
FIG. 6D is a sectional view taken along the line 6D-6D in FIG. 6A.
FIG. 6E is a sectional view taken along the line 6E-6E in FIG. 6A.
Figure 7A:
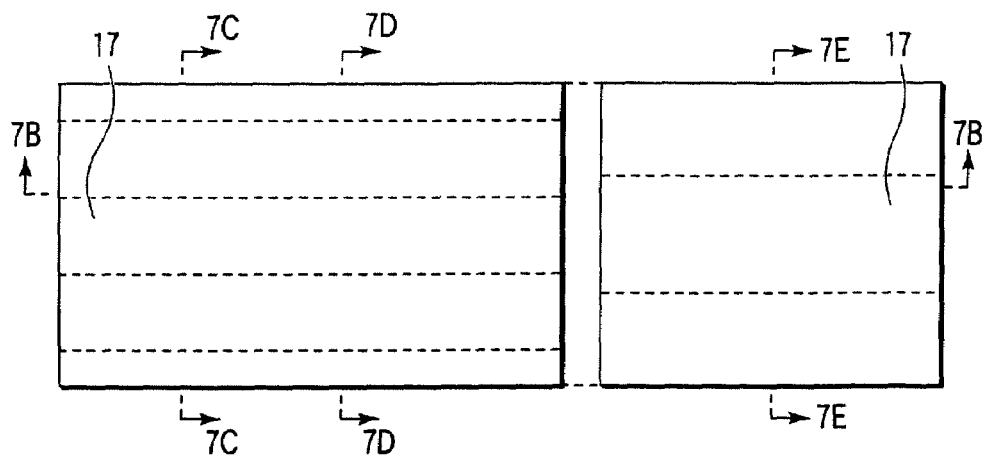
FIG. 7A is a plan view showing one of the main steps of manufacturing a nonvolatile semiconductor memory according to the embodiment of the present invention.
Figure 7B:
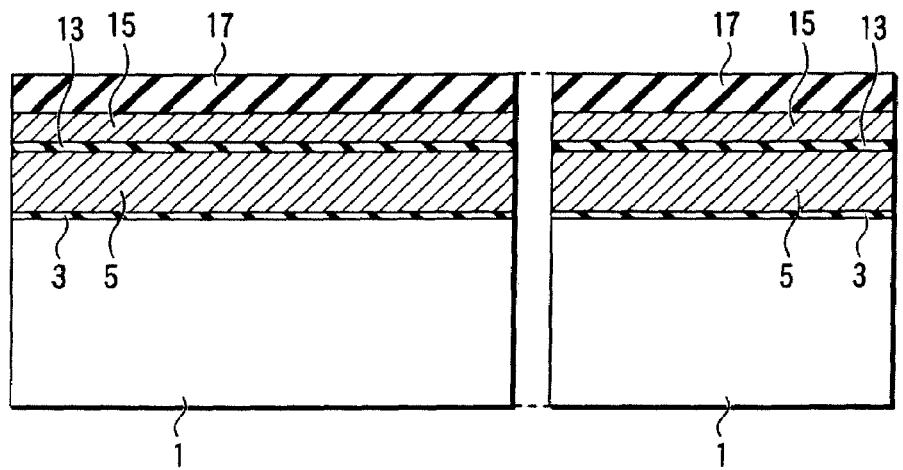
FIG. 7B is a sectional view taken along the line 7B-7B in FIG. 7A.
Figures 7C, 7D, 7E:
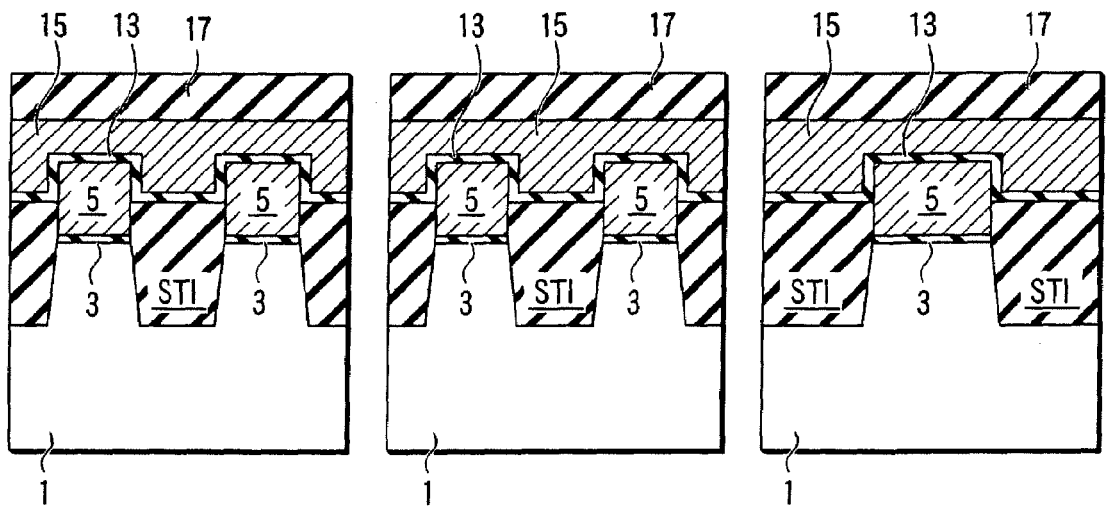
FIG. 7C is a sectional view taken along the line 7C-7C in FIG. 7A.
FIG. 7D is a sectional view taken along the line 7D-7D in FIG. 7A.
FIG. 7E is a sectional view taken along the line 7E-7E in FIG. 7A.
Figure 8A:
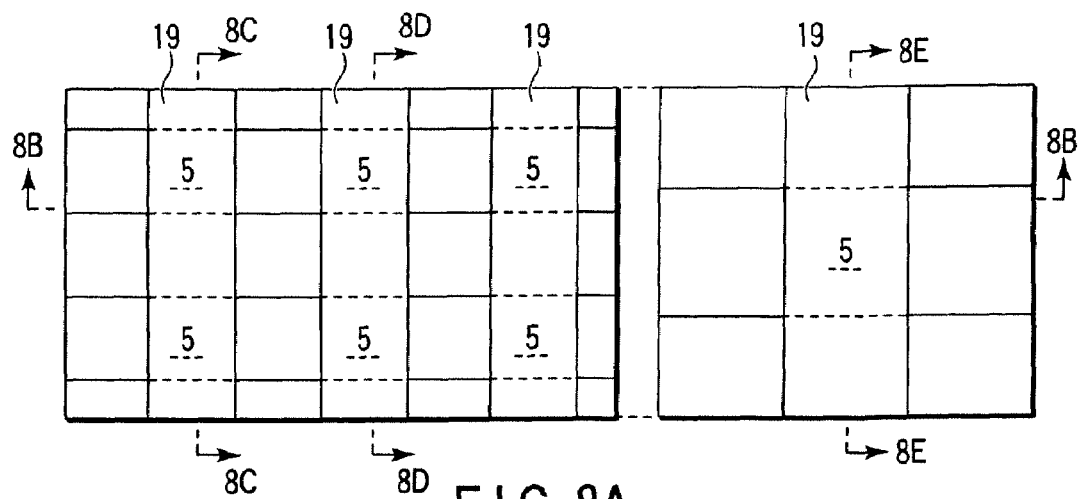
FIG. 8A is a plan view showing one of the main steps of manufacturing a nonvolatile semiconductor memory according to the embodiment of the present invention.
Figure 8B:
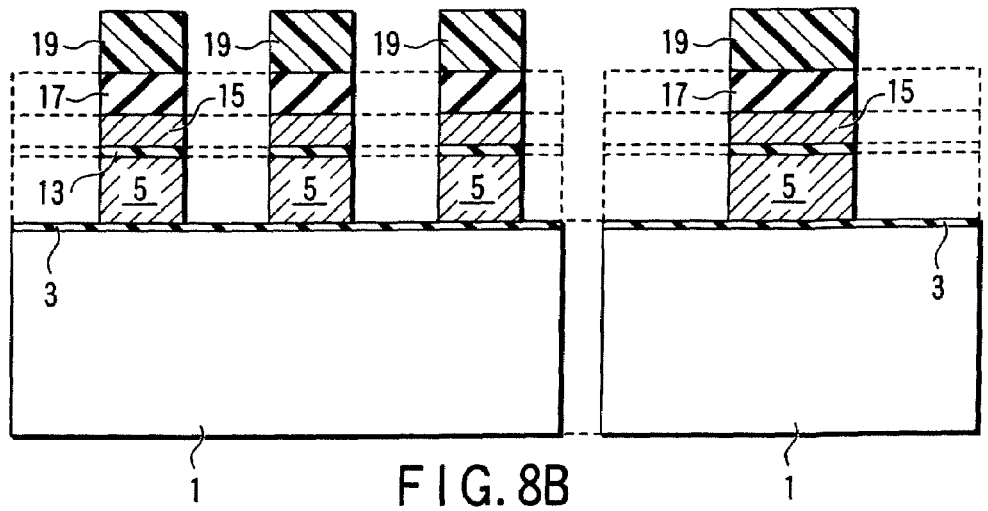
FIG. 8B is a sectional view taken along the line 8B-8B in FIG. 8A.
Figures 8C, 8D, 8E:
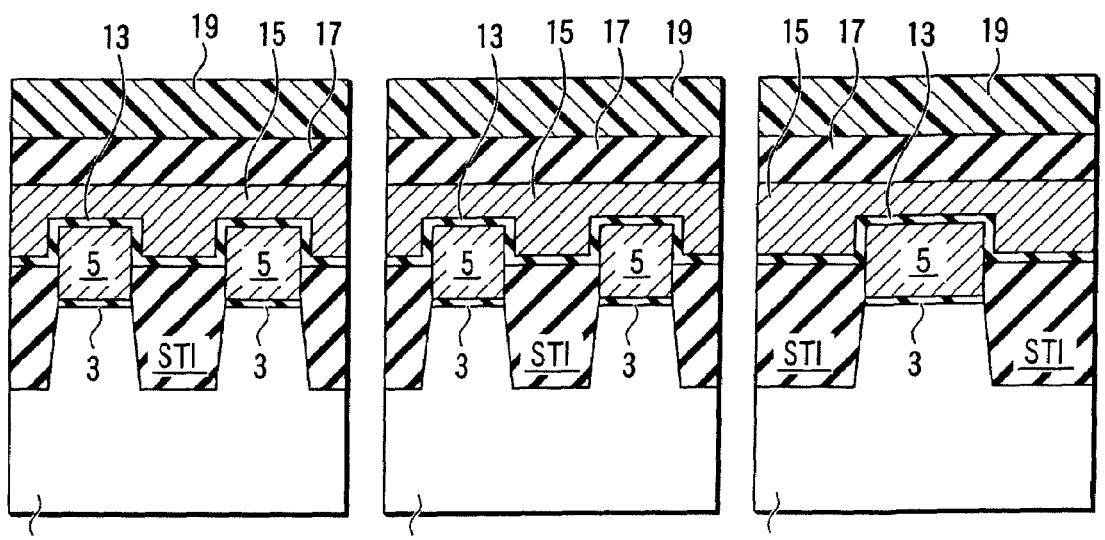
FIG. 8C is a sectional view taken along the line 8C-8C in FIG. 8A.
FIG. 8D is a sectional view taken along the line 8D-8D in FIG. 8A.
FIG. 8E is a sectional view taken along the line 8E-8E in FIG. 8A.
Figure 9A:
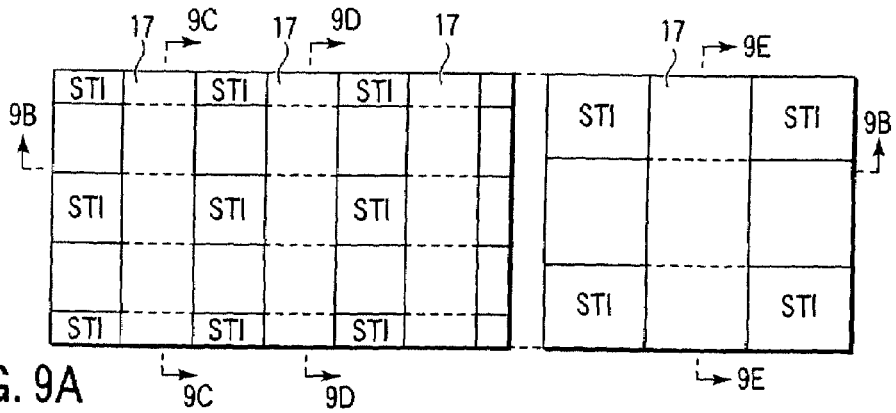
FIG. 9A is a plan view showing one of the main steps of manufacturing a nonvolatile semiconductor memory according to the embodiment of the present invention.
Figure 9B:
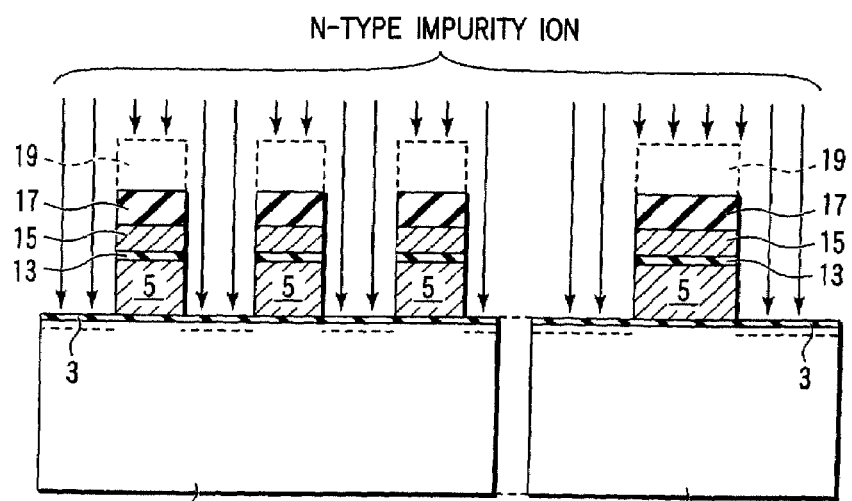
FIG. 9B is a sectional view taken along the line 9B-9B in FIG. 9A.
Figures 9C, 9D, 9E:
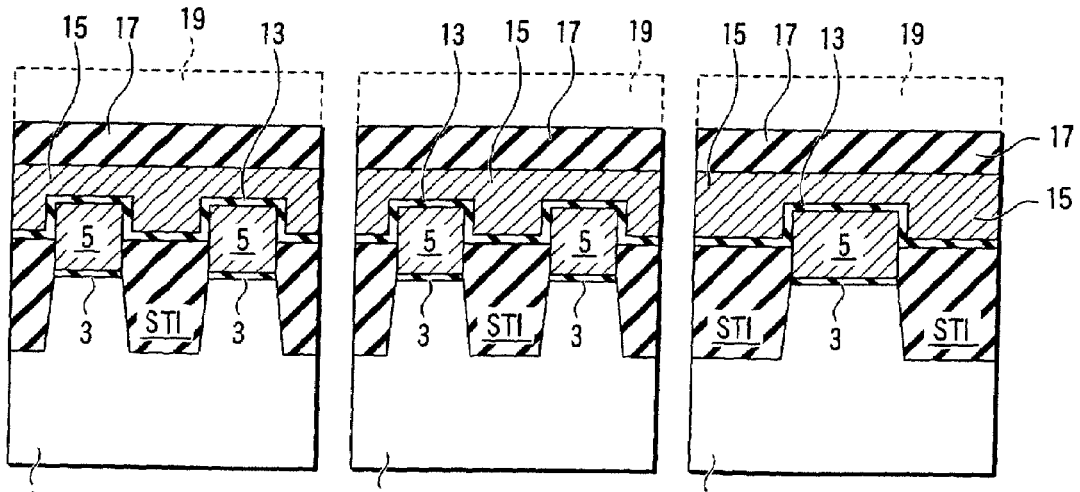
FIG. 9C is a sectional view taken along the line 9C-9C in FIG. 9A.
FIG. 9D is a sectional view taken along the line 9D-69D in FIG. 9A.
FIG. 9E is a sectional view taken along the line 9E-9E in FIG. 9A.
Figures 10C, 10D, 10E:
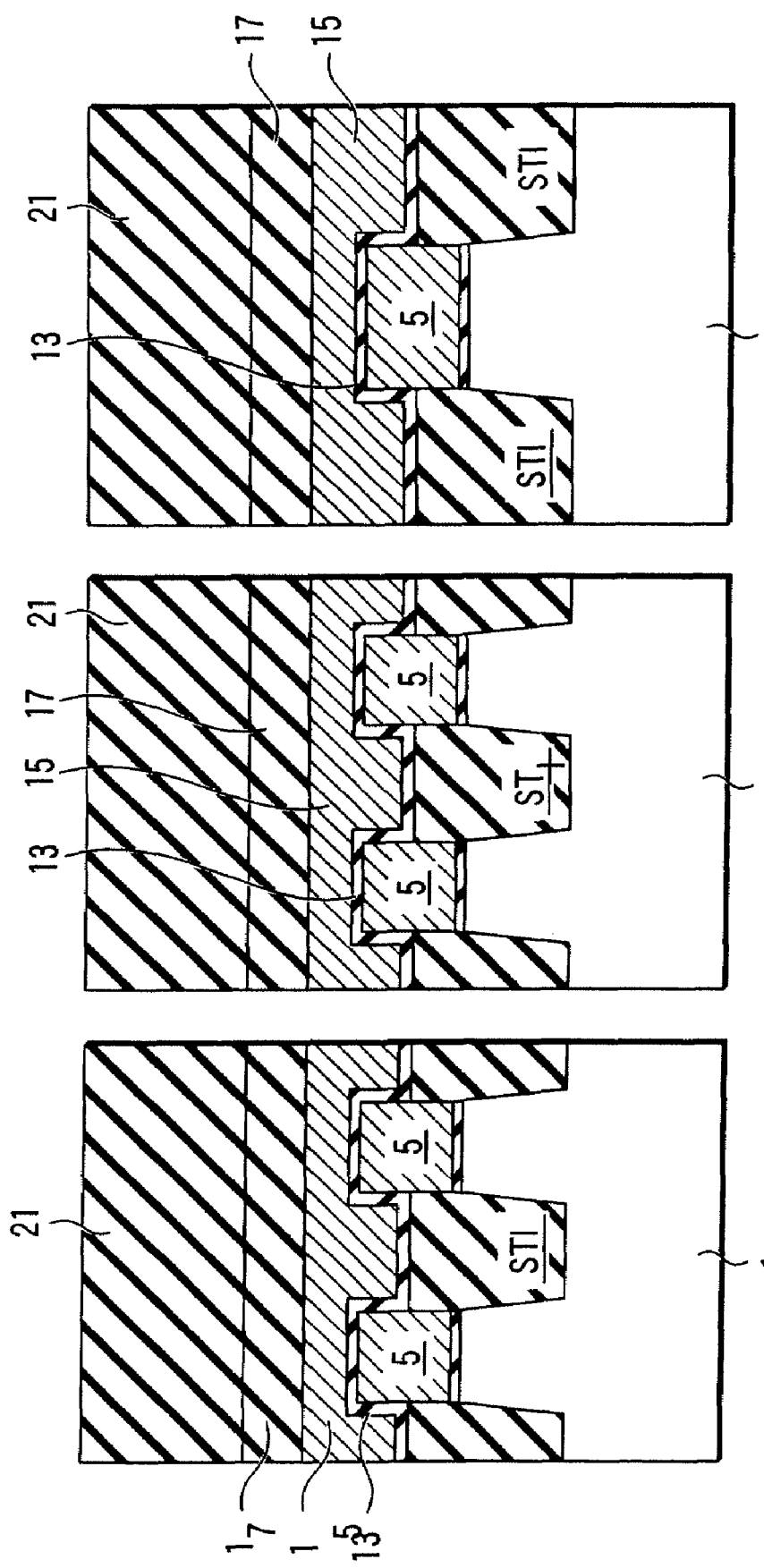
FIG. 10C is a sectional view taken along the line 10C-10C in FIG. 10A.
FIG. 10D is a sectional view taken along the line 10D-10D in FIG. 10A.
FIG. 10E is a sectional view taken along the line 10E-10E in FIG. 10A.
Figure 11A:
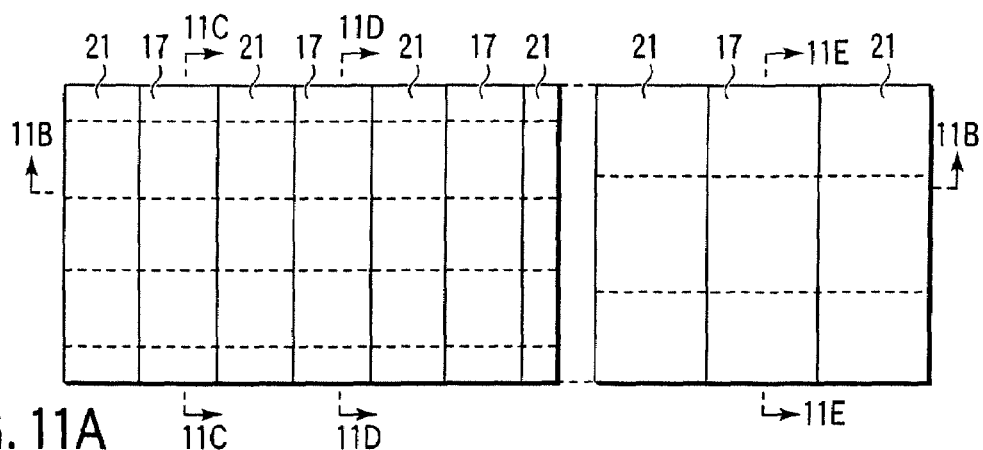
FIG. 11A is a plan view showing one of the main steps of manufacturing a nonvolatile semiconductor memory according to the embodiment of the present invention.
Figure 11B:
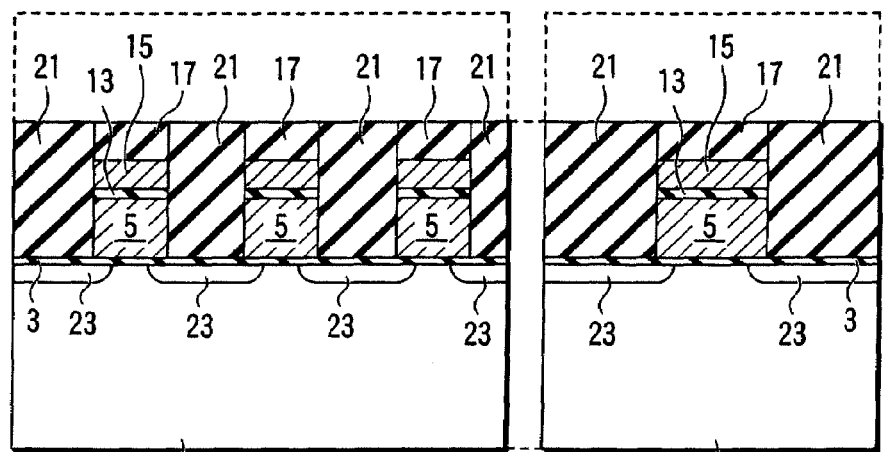
FIG. 11B is a sectional view taken along the line 11B-11B in FIG. 11A.
Figures 11C, 11D, 11E:
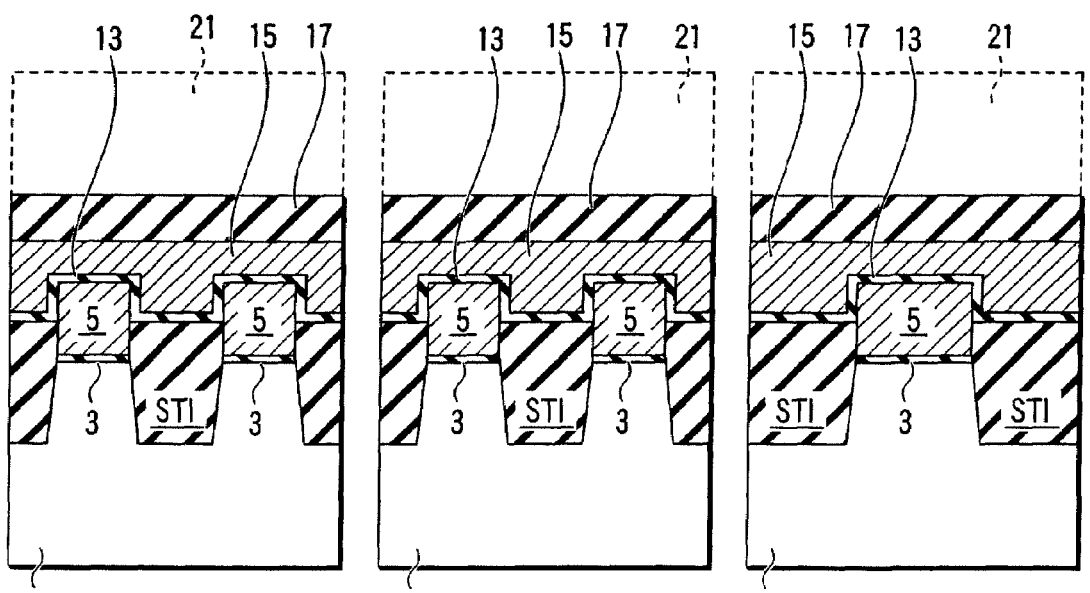
FIG. 11C is a sectional view taken along the line 11C-11C in FIG. 11A.
FIG. 11D is a sectional view taken along the line 11D-11D in FIG. 11A.
FIG. 11E is a sectional view taken along the line 11E-11E in FIG. 11A.
Figure 12A:
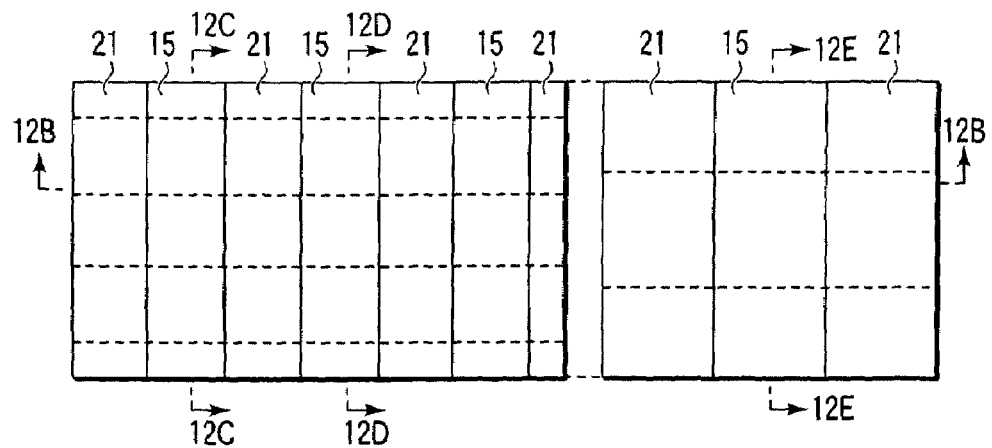
FIG. 12A is a plan view showing one of the main steps of manufacturing a nonvolatile semiconductor memory according to the embodiment of the present invention.
Figure 12B:
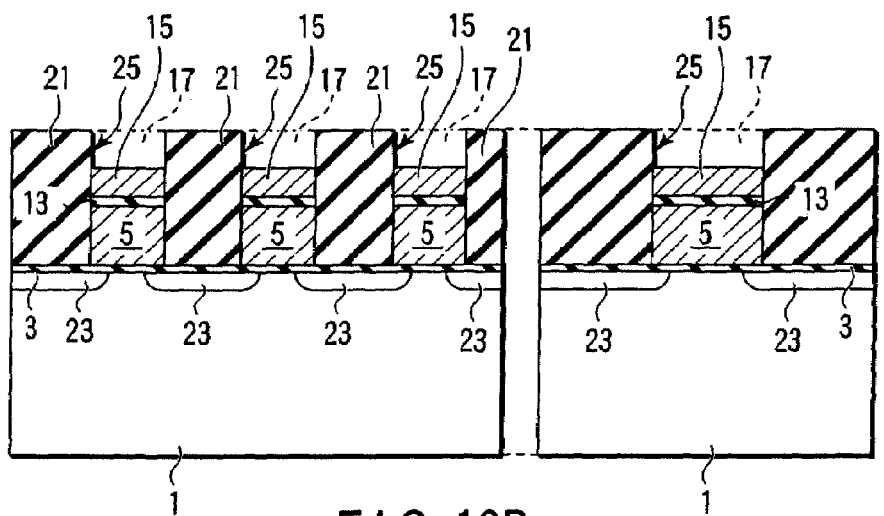
FIG. 12B is a sectional view taken along the line 12B-12B in FIG. 12A.
Figures 12C, 12D, 12E:
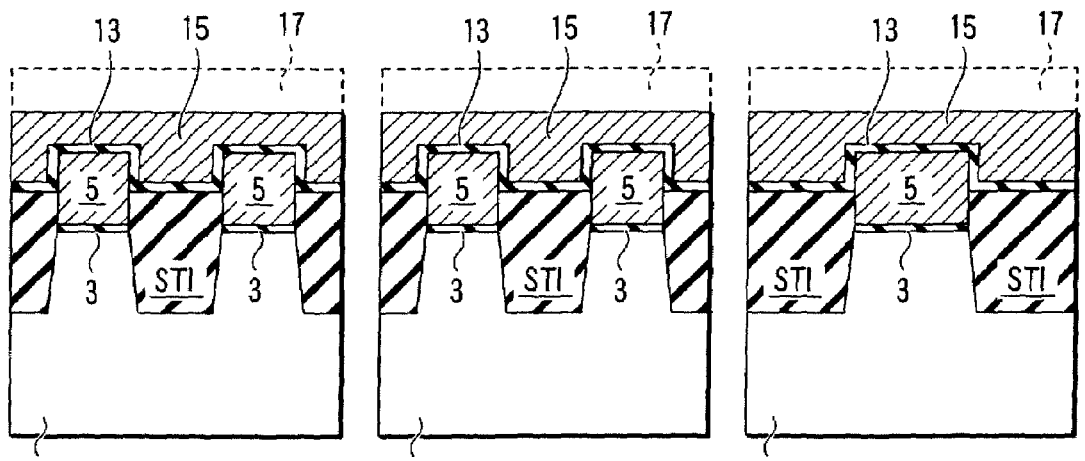
FIG. 12C is a sectional view taken along the line 12C-12C in FIG. 12A.
FIG. 12D is a sectional view taken along the line 12D-12D in FIG. 12A.
FIG. 12E is a sectional view taken along the line 12E-12E in FIG. 12A.
Figure 13A:
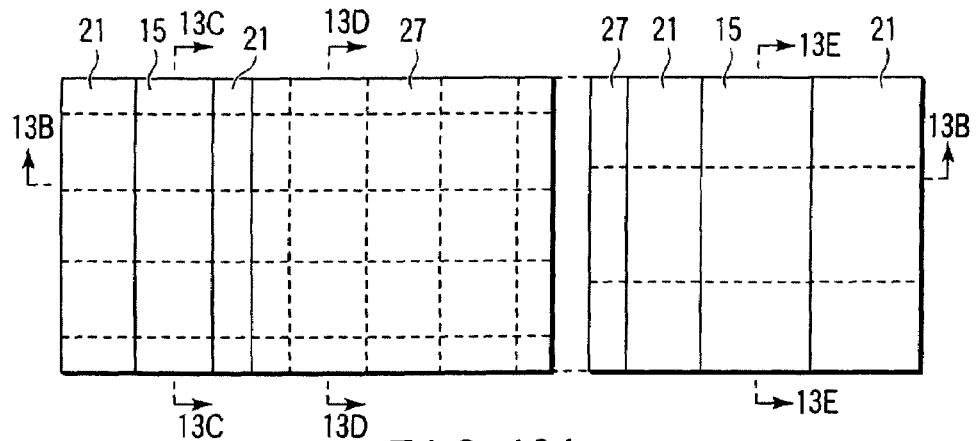
FIG. 13A is a plan view showing one of the main steps of manufacturing a nonvolatile semiconductor memory according to the embodiment of the present invention.
Figure 13B:
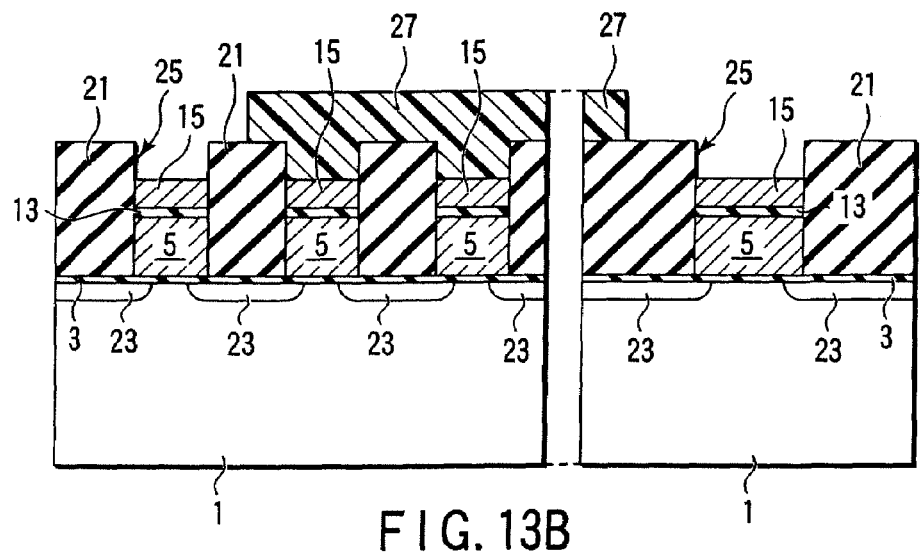
FIG. 13B is a sectional view taken along the line 13B-13B in FIG. 13A.
Figures 13C, 13D, 13E:
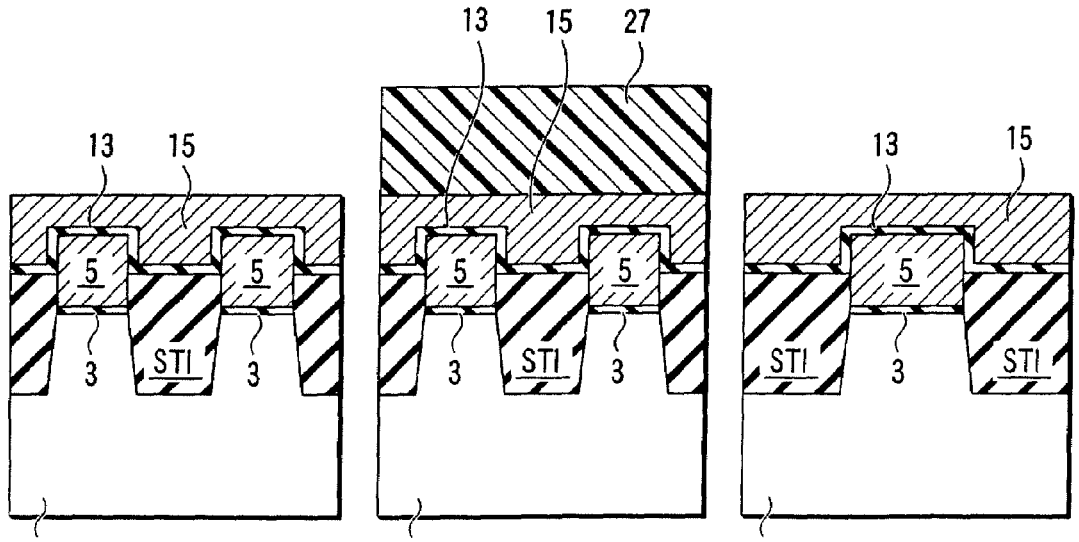
FIG. 13C is a sectional view taken along the line 13C-13C in FIG. 13A.
FIG. 13D is a sectional view taken along the line 13D-13D in FIG. 13A.
FIG. 13E is a sectional view taken along the line 13E-13E in FIG. 13A.
Figure 14A:
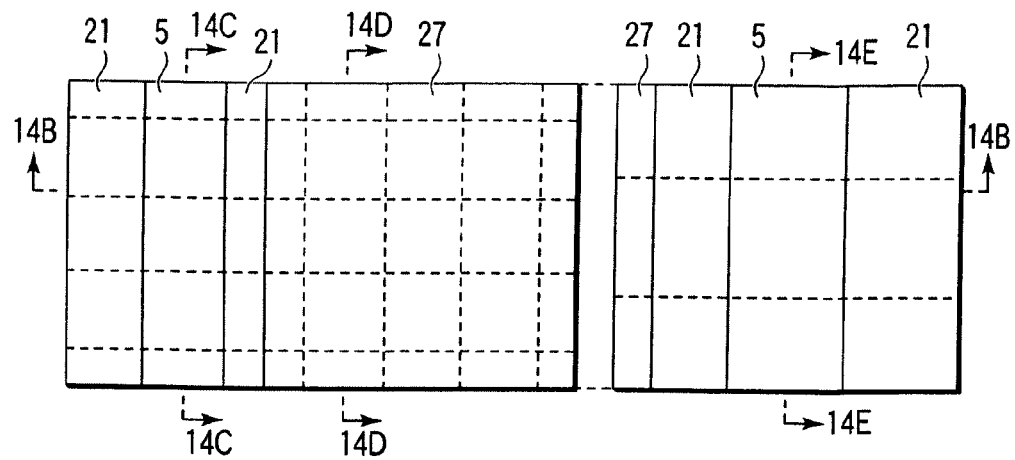
FIG. 14A is a plan view showing one of the main steps of manufacturing a nonvolatile semiconductor memory according to the embodiment of the present invention.
Figure 14B:
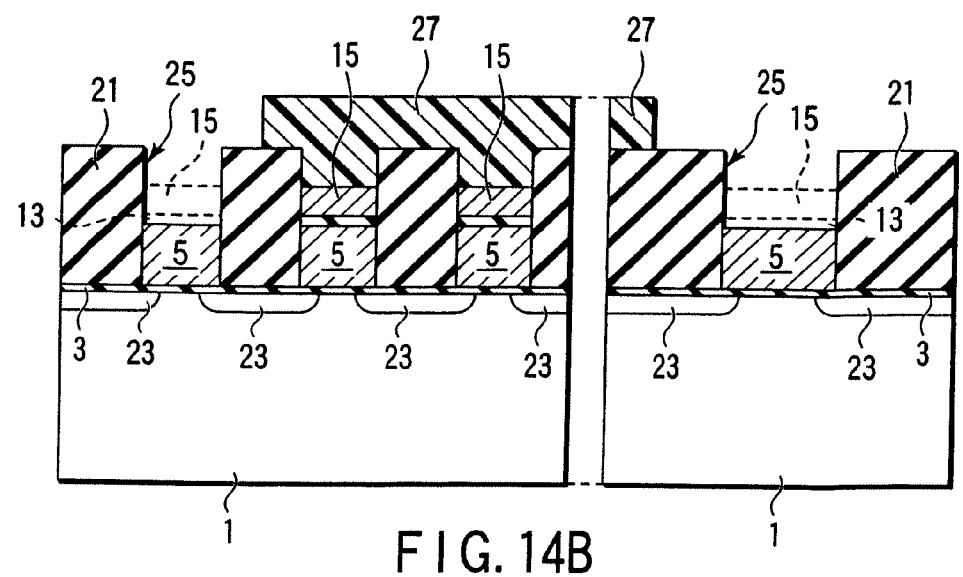
FIG. 14B is a sectional view taken along the line 14B-14B in FIG. 14A.
Figures 14C, 14D, 14E:
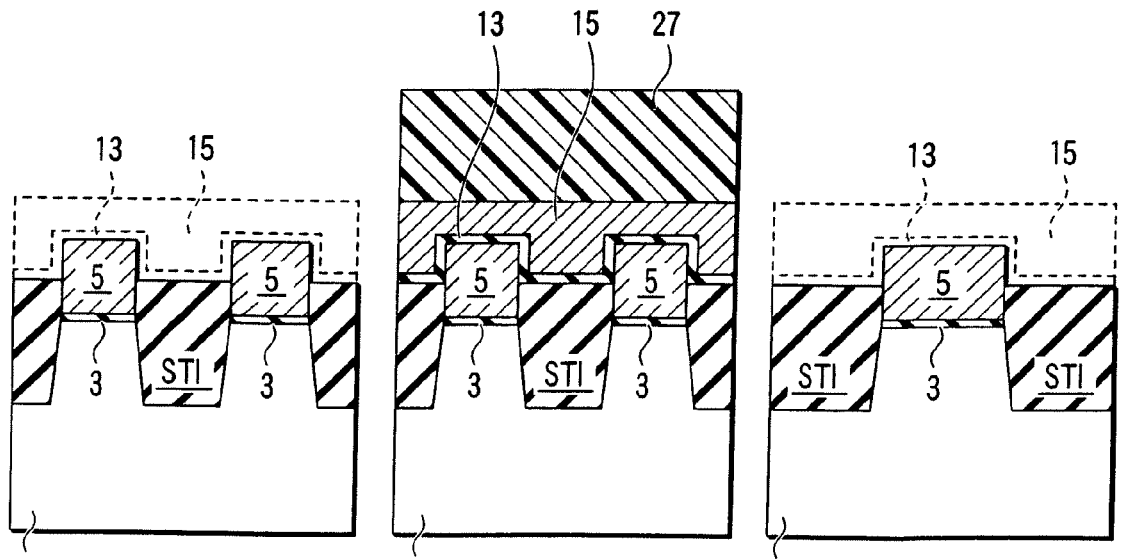
FIG. 14C is a sectional view taken along the line 14C-14C in FIG. 14A.
FIG. 14D is a sectional view taken along the line 14D-14D in FIG. 14A.
FIG. 14E is a sectional view taken along the line 14E-14E in FIG. 14A.
Figure 15A:
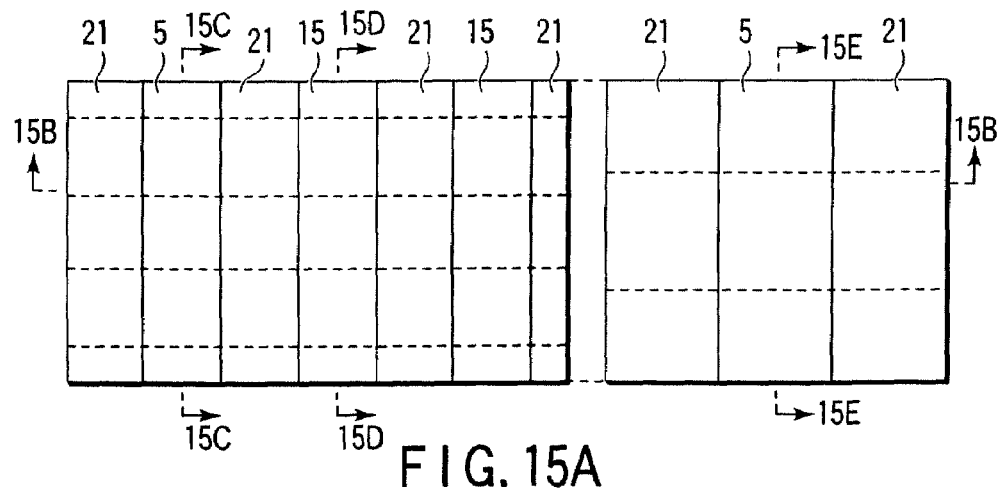
FIG. 15A is a plan view showing one of the main steps of manufacturing a nonvolatile semiconductor memory according to the embodiment of the present invention.
Figure 15B:
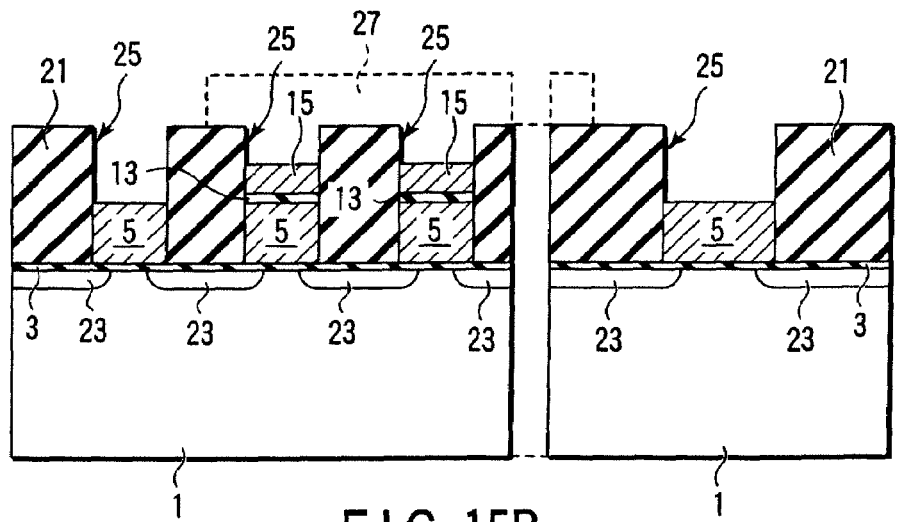
FIG. 15B is a sectional view taken along the line 15B-15B in FIG. 15A.
Figures 15C, 15D, 15E:
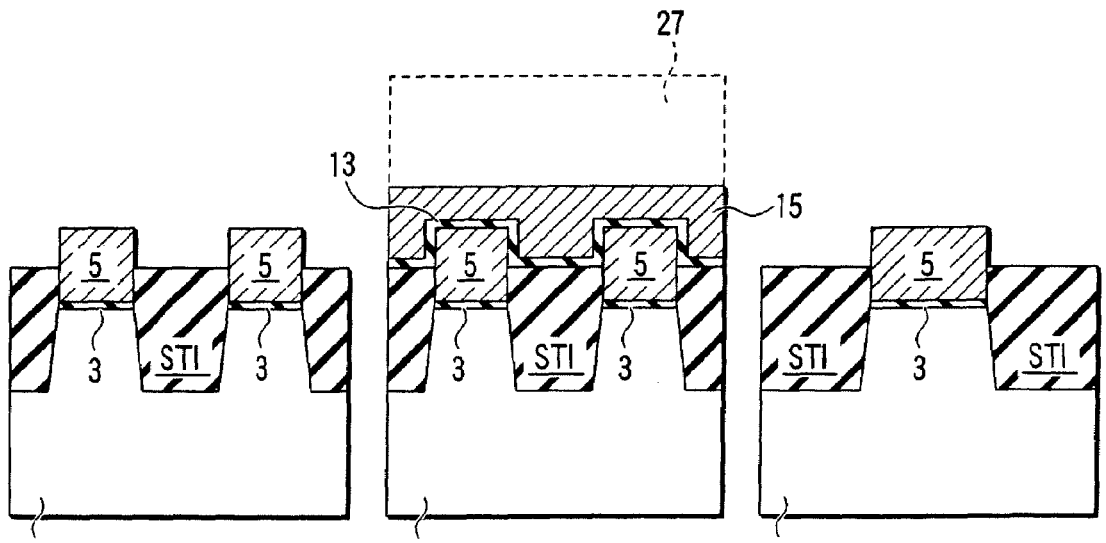
FIG. 15C is a sectional view taken along the line 15C-15C in FIG. 15A.
FIG. 15D is a sectional view taken along the line 15D-15D in FIG. 15A.
FIG. 15E is a sectional view taken along the line 15E-15E in FIG. 15A.
Figure 16A:
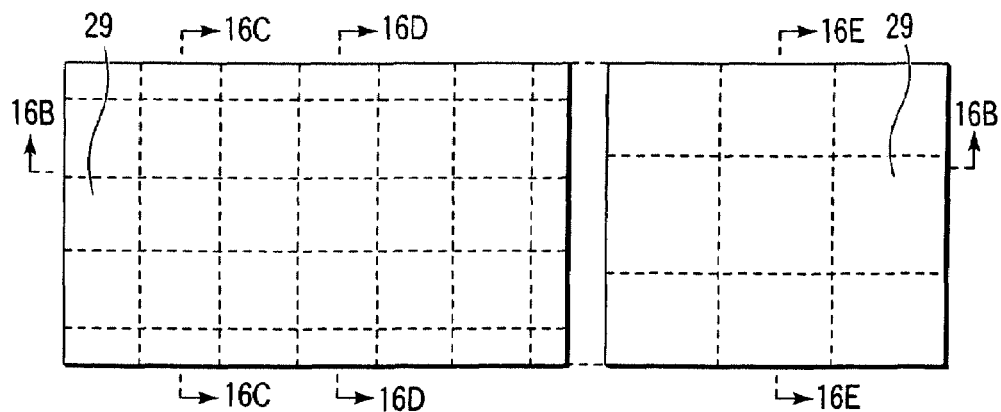
FIG. 16A is a plan view showing one of the main steps of manufacturing a nonvolatile semiconductor memory according to the embodiment of the present invention.
Figure 16B:
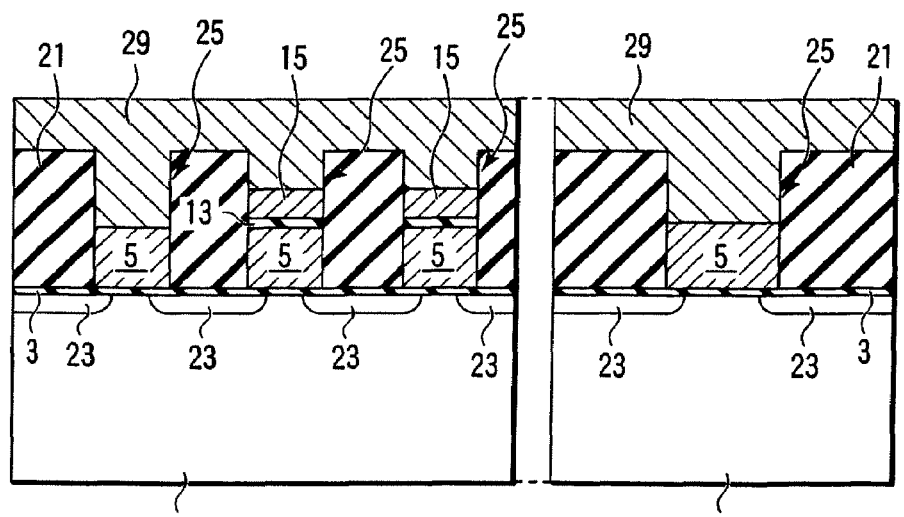
FIG. 16B is a sectional view taken along the line 16B-16B in FIG. 16A.
Figures 16C, 16D, 16E:
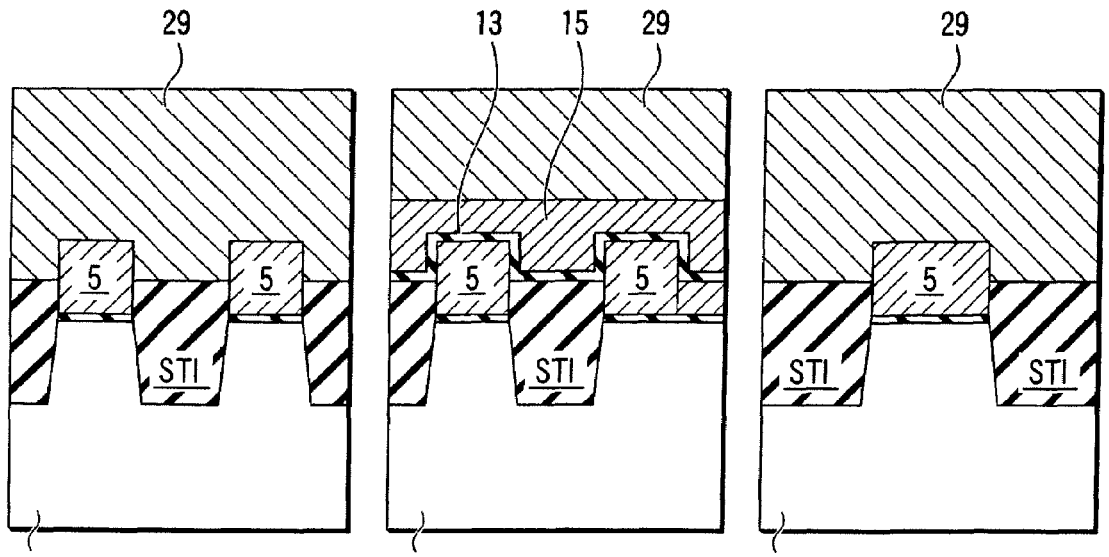
FIG. 16C is a sectional view taken along the line 16C-16C in FIG. 16A.
FIG. 16D is a sectional view taken along the line 16D-16D in FIG. 16A.
FIG. 16E is a sectional view taken along the line 16E-16E in FIG. 16A.
Figure 17A:
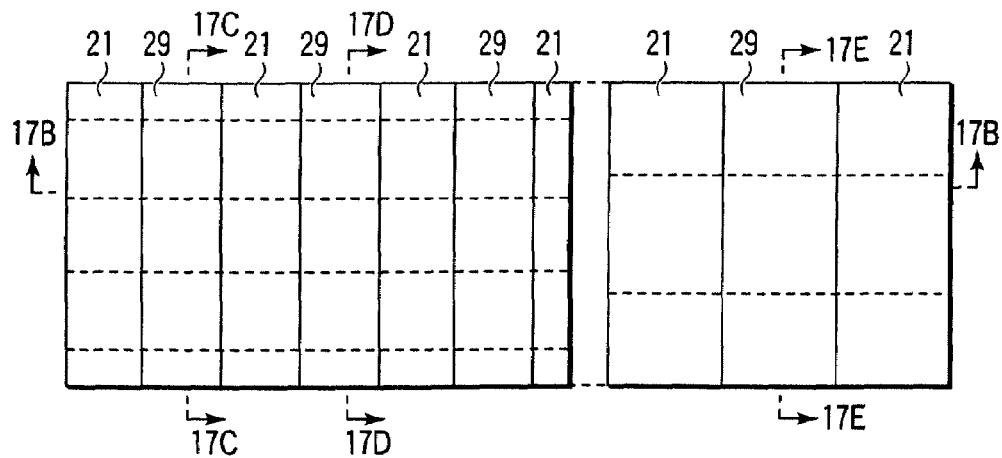
FIG. 17A is a plan view showing one of the main steps of manufacturing a nonvolatile semiconductor memory according to the embodiment of the present invention.
Figure 17B:
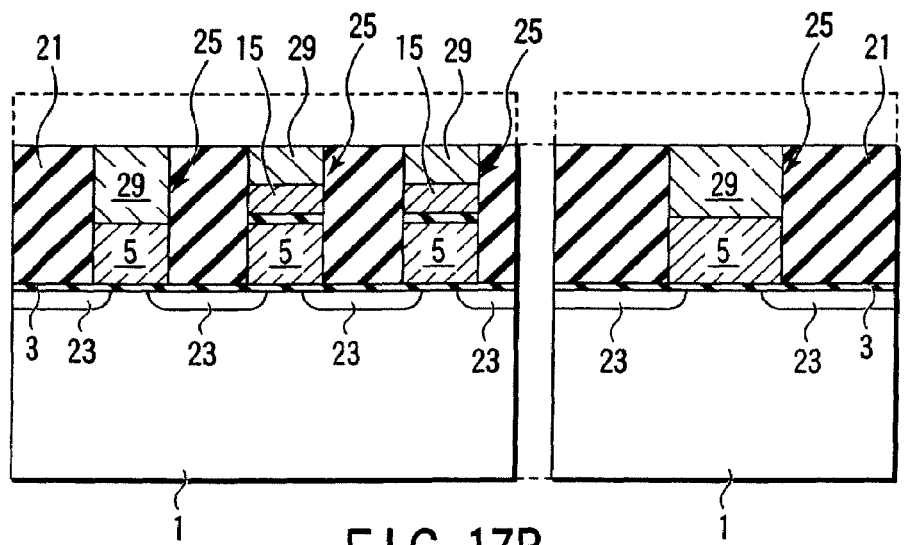
FIG. 17B is a sectional view taken along the line 17B-17B in FIG. 17A.
Figures 17C, 17D, 17E:
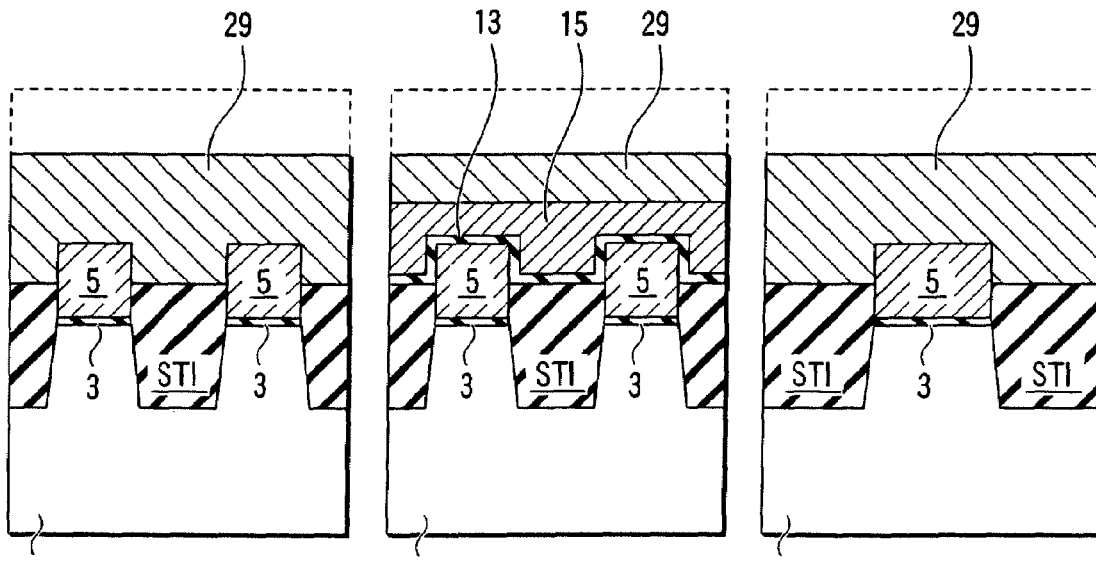
FIG. 17C is a sectional view taken along the line 17C-17C in FIG. 17A.
FIG. 17D is a sectional view taken along the line 17D-17D in FIG. 17A.
FIG. 17E is a sectional view taken along the line 17E-17E in FIG. 17A.
Figure 18A:
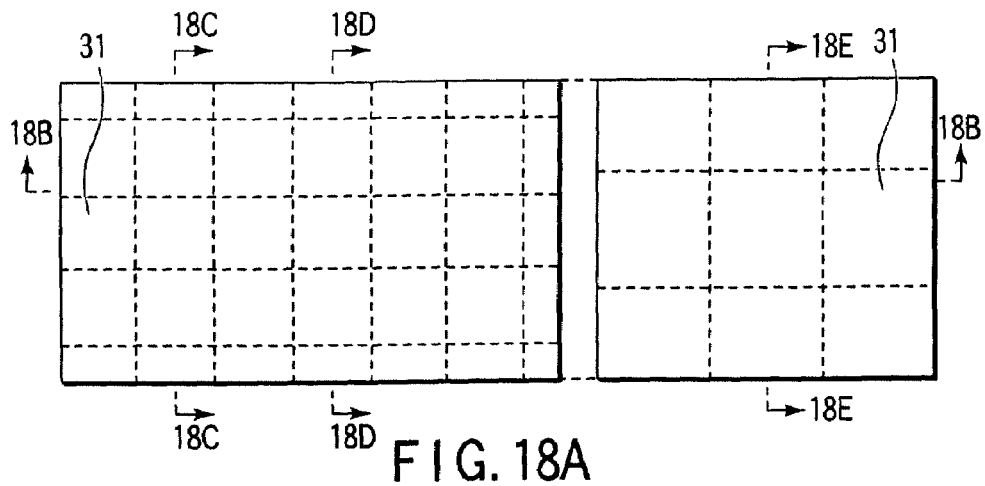
FIG. 18A is a plan view showing one of the main steps of manufacturing a nonvolatile semiconductor memory according to the embodiment of the present invention.
Figure 18B:
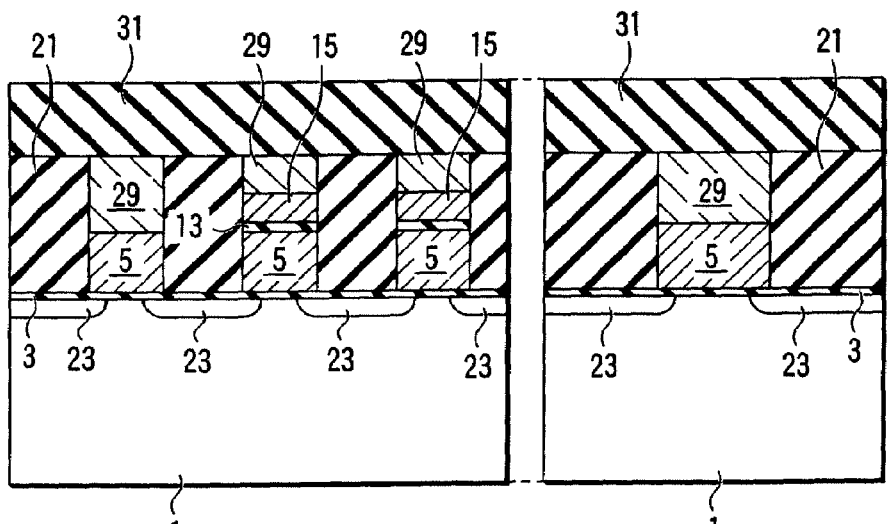
FIG. 18B is a sectional view taken along the line 18B-18B in FIG. 18A.
Figures 18C, 18D, 18E:
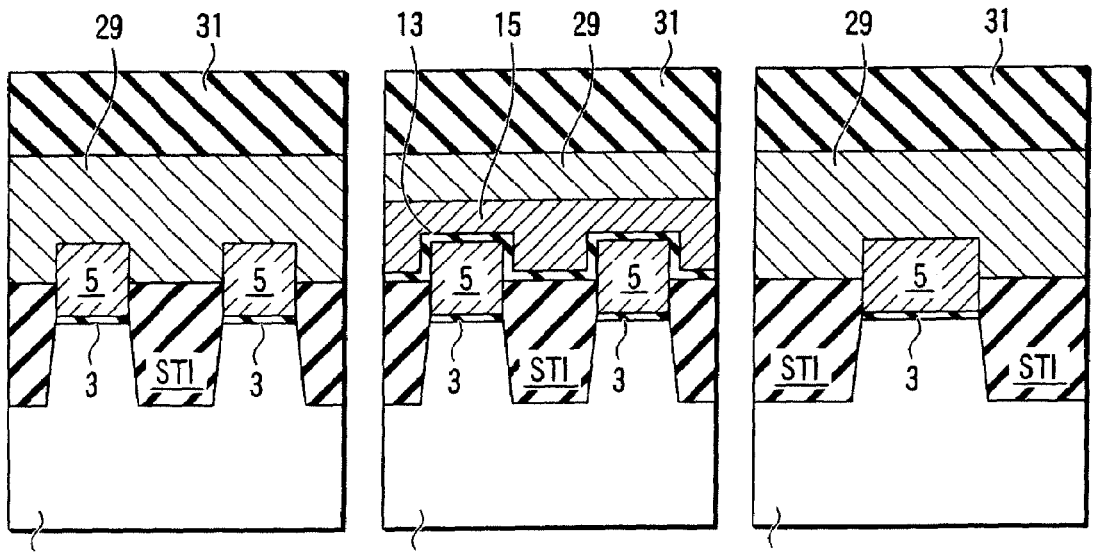
FIG. 18C is a sectional view taken along the line 18C-18C in FIG. 18A.
FIG. 18D is a sectional view taken along the line 18D-18D in FIG. 18A.
FIG. 18E is a sectional view taken along the line 18E-18E in FIG. 18A.
Figure 19A:
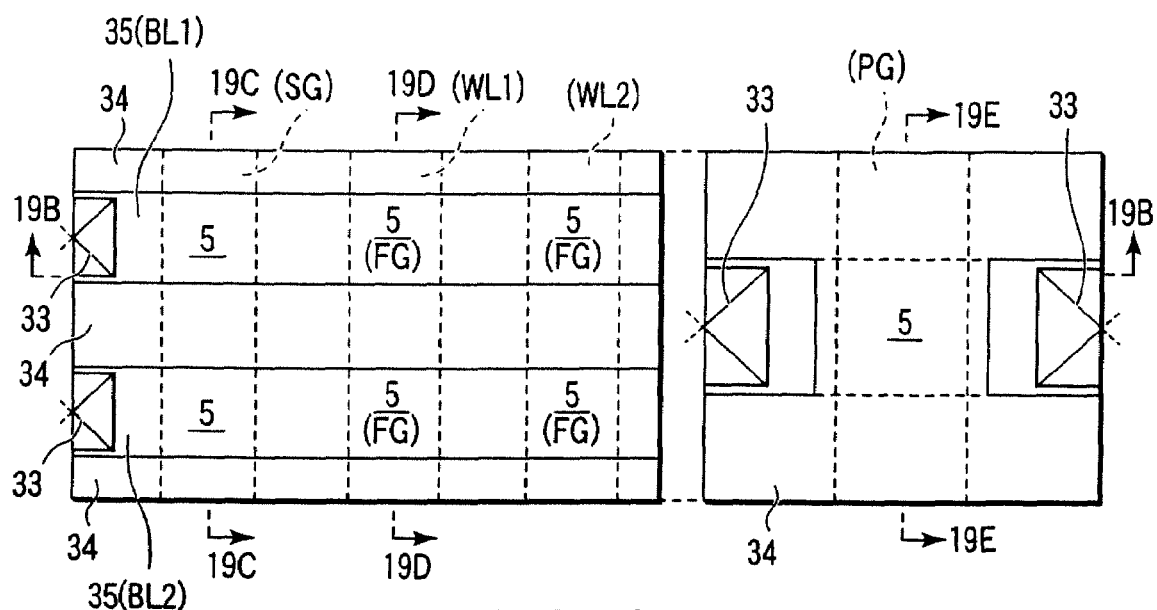
FIG. 19A is a plan view showing one of the main steps of manufacturing a nonvolatile semiconductor memory according to the embodiment of the present invention.
Figure 19B:
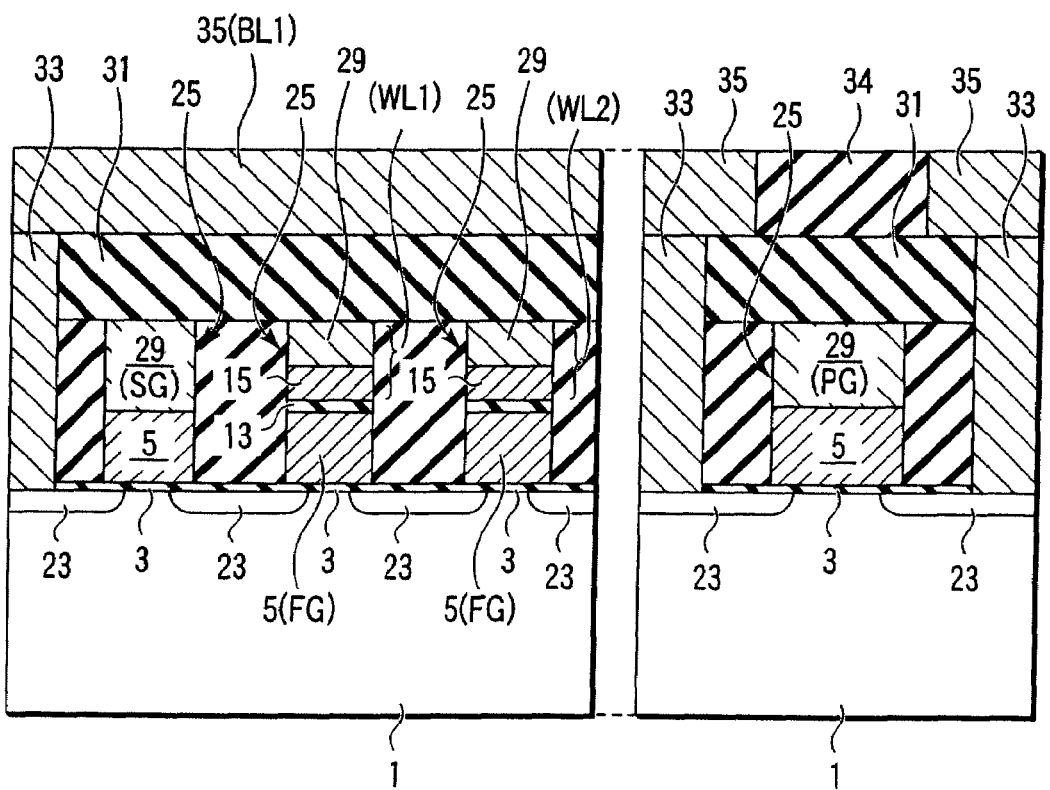
FIG. 19B is a sectional view taken along the line 19B-19B in FIG. 19A.

For example, in the present example, the word lines WL are structures in which the metal layers 29 are formed on the polysilicon layers 15, and are so-called polymetal structures. Therefore, as compared with the device, which was described with reference to FIGS. 1A to 1C, and which has the word line WL structured from the conductive polysilicon layer 115 or the word line WL having a polycide structure, an increase in the resistance value of the word line WL can be suppressed, and therefore, the resistance value can be decreased.

Further, a portion of the gates of the select transistor, i.e., the select gate line SG, is metal embedded in the wiring trench 25SG. Therefore, in the same way as the word line WL, an increase in the resistance value of the select gate line SG can be suppressed, and therefore, the resistance value can be decreased.

Moreover, one portion of the gate PG of the peripheral transistor is metal embedded in the wiring trench 25PG. Therefore, in the same way as the word line WL and the select gate line SG, at the gate PG of the peripheral transistor as well, an increase in the resistance value can be suppressed, and therefore, the resistance value can be decreased.

In this way, in accordance with the NAND type nonvolatile semiconductor memory which can suppress an increase in the resistance value of the word line WL, the select gate line SG, and the gate PG of the peripheral transistor, effects such as increasing the speed of operation Iand, reducing the electric power consumption can be obtained.

Further, in the nonvolatile semiconductor memory according to the embodiment, the step of removing the inter-gate insulator 13 from the select transistor portion is carried out by using the first interlayer insulators 21 as masks. Therefore, there is no need to form the mask layer 141 as described with reference to FIGS. 2A and 2B, for example.

Moreover, in the nonvolatile semiconductor memory according to the embodiment, at the time of removing the inter-gate insulator 13, the stacked gate structures including the FG polysilicon layers 5, the inter-gate insulator 13, the polysilicon layers 15, and the cap layer 17 are already formed. Therefore, for example, there is no need to give consideration such that the portion from which the ONO film 113 is removed is exactly positioned under the mask layer 119 as described with reference to FIGS. 3A and 3B. Of course, there is no need for slit processing.

Accordingly, in the nonvolatile semiconductor memory according to the embodiment, there is no need for a space Dcell-SG from the select gate line SG to the word line WL to be made broader than a space Dcell from the word line WL to the word line WL. Therefore, as shown in FIG. 20, for example, the space Dcell-SG and the space Dcell can be set to be equal, and integration of the nonvolatile semiconductor memory in, for example, the direction perpendicular to the word line WL, for example, the direction along the bit line BL, can be improved.

Further, for example, in the device described with reference to FIGS. 4A to 4C, the select gate SG is structured from a conductive polysilicon. Therefore, the resistance value of the select gate SG becomes high. Therefore, in order to use it in practice, as shown in FIG. 21, in addition to the select gate SG, a low-resistance select gate SG2 is formed. Further, there is the need to shunt the low-resistance select gate SG2 to the select gate SG structured from conductive polysilicon, for example, each 512 bits. Therefore, improvement of integration in, for example, the direction along the word line WL is prevented.

On the other hand, in the nonvolatile semiconductor memory according to the embodiment, because the select gate SG is structured to include a low-resistance metal, there is no need to form the low-resistance select gate SG2 as shown in FIG. 21. Therefore, integration in, for example, the direction along the word line WL can be improved.

Although a nonvolatile semiconductor memory according to the embodiment of the present invention was described above, the present invention is not limited to this embodiment, and at the time of implementing of the present invention, various changes are possible within a range which does not deviate from the gist of the present invention. Moreover, the embodiment described above is not the only one embodiment of the present invention.

Moreover, various stages of the invention are included in the above-described one embodiment, and various stages of the invention can be extracted by appropriate combinations of a plurality of structural conditions disclosed in the embodiment.

As described above, in accordance with the nonvolatile semiconductor memory and the manufacturing method according to the embodiment of the present invention, the difficulties of lowering the resistance value of the wiring accompanying the miniaturization of a nonvolatile semiconductor memory can be mitigated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device including a memory cell transistor and a select gate transistor, comprising:
    a silicon substrate;
    a gate insulator formed on the silicon substrate;
    a first gate electrode of the memory cell transistor, including a floating gate electrode having a first polysilicon layer formed on the gate insulator, an inter-gate insulator formed on the floating gate electrode, and a control gate electrode having a second polysilicon layer formed on the inter-gate insulator and a first metal layer formed on the second polysilicon layer; and
    a second gate electrode of the select gate transistor, located adjacent to the first gate electrode, including a third polysilicon layer formed on the gate insulator and a second metal layer formed on the third polysilicon layer,
    wherein a height of an upper surface of the first polysilicon layer is same as a height of an upper surface of the third polysilicon layer, and a height of an upper surface of the first metal layer is same as a height of an upper surface of the second metal layer, relative to an upper surface of the silicon substrate, a width of the second polysilicon layer is same as a width of the first metal layer, and a width of the third polysilicon layer is same as a width of the second metal layer.

2. The device according to claim 1, wherein the first and second metal layers include a tungsten.

3. A nonvolatile semiconductor memory device including a memory cell array region and a peripheral circuit region, comprising:
- a silicon substrate;
- a first gate insulator formed on the silicon substrate of the memory cell array region;
- a second gate insulator formed on the silicon substrate of the peripheral circuit region;
- a first gate electrode including a floating gate electrode having a first polysilicon layer formed on the first gate insulator, an inter-gate insulator formed on the floating gate electrode, and a control gate electrode having a second polysilicon layer formed on the inter-gate insulator and a first metal layer formed on the second polysilicon layer; and
- a second gate electrode including a third polysilicon layer formed on the second gate insulator, and a second metal layer formed on the third polysilicon layer,
- wherein a height of an upper surface of the first polysilicon layer is same as a height of an upper surface of the third polysilicon layer, and a height of an upper surface of the first metal layer is same as a height of an upper surface of the second metal layer, relative to an upper surface of the silicon substrate, a width of the second polysilicon layer is same as a width of the first metal layer, and a width of the third polysilicon layer is same as a width of the second metal layer.

4. The device according to claim 3, wherein the first and second metal layers include a tungsten.

5. The device according to claim 3, wherein a thickness of the first gate insulator is same as a thickness of the second gate insulator.

6. A nonvolatile semiconductor memory device including a memory cell array region and a peripheral circuit region, comprising:
- a silicon substrate;
- a first gate insulator formed on the silicon substrate of the memory cell array region;
- a second gate insulator formed on the silicon substrate of the peripheral circuit region;
- a first gate electrode including a floating gate electrode having a first polysilicon layer formed on the first gate insulator, an inter-gate insulator formed on the floating gate electrode, and a control gate electrode having a second polysilicon layer formed on the inter-gate insulator and a first metal layer formed on the second polysilicon layer;
- a second gate electrode including a third polysilicon layer formed on the second gate insulator, and a second metal layer formed on the third polysilicon layer, and
- a third gate electrode including a fourth polysilicon layer formed on the first gate insulator, and a third metal layer formed on the fourth polysilicon layer,
- wherein a height of an upper surface of the first polysilicon layer is same as a height of an upper surface of the fourth polysilicon layer, and a height of an upper surface of the first metal layer is same as a height of an upper surface of the third metal layer relative to an upper surface of the silicon substrate, a width of the second polysilicon layer is same as a width of the first metal layer, and a width of the fourth polysilicon layer is same as a width of the third metal layer.

7. The device according to claim 6, wherein the first, second and third metal layers include a tungsten.

* * * * *